(12) United States Patent
Akiyama et al.

(10) Patent No.: US 8,123,108 B2
(45) Date of Patent: Feb. 28, 2012

(54) METHOD OF MANUFACTURING SEMICONDUCTOR DEVICE AND WIRE BONDING APPARATUS

(75) Inventors: Shinichi Akiyama, Tokyo (JP); Hiroaki Yoshino, Tokyo (JP); Shinsuke Tei, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 0 days.

(21) Appl. No.: 13/014,109

(22) Filed: Jan. 26, 2011

(65) Prior Publication Data

US 2011/0180590 A1 Jul. 28, 2011

(30) Foreign Application Priority Data

Jan. 27, 2010 (JP) ................................. 2010-015683
Dec. 6, 2010 (JP) ................................. 2010-271255

(51) Int. Cl.
*B23K 31/02* (2006.01)
(52) U.S. Cl. ..................... 228/180.5; 228/4.5
(58) Field of Classification Search ........................ None
See application file for complete search history.

(56) References Cited

U.S. PATENT DOCUMENTS

| | | | |
|---|---|---|---|
| 6,774,494 B2 | 8/2004 | Arakawa | |
| 7,214,606 B2 | 5/2007 | Wong et al. | |
| 2002/0137327 A1 | 9/2002 | Arakawa | |
| 2005/0092815 A1* | 5/2005 | Mii ............................. | 228/180.5 |
| 2005/0189567 A1* | 9/2005 | Fujisawa ...................... | 257/200 |
| 2007/0029367 A1 | 2/2007 | Mii | |
| 2007/0287222 A1 | 12/2007 | Natsume | |
| 2008/0116548 A1 | 5/2008 | Li et al. | |
| 2008/0197510 A1* | 8/2008 | Mii et al. ...................... | 257/780 |
| 2010/0148369 A1* | 6/2010 | Mii et al. ...................... | 257/773 |
| 2010/0230809 A1* | 9/2010 | Calpito et al. ................ | 257/737 |
| 2010/0237480 A1* | 9/2010 | Mii et al. ...................... | 257/676 |
| 2010/0248470 A1* | 9/2010 | Mii et al. ...................... | 438/617 |

FOREIGN PATENT DOCUMENTS

| | | |
|---|---|---|
| JP | 60-182730 | 9/1985 |
| JP | 1-276729 | 11/1989 |
| JP | 3-289149 | 12/1991 |
| JP | 2002-280414 | 9/2002 |

(Continued)

OTHER PUBLICATIONS

Derwent: ACC No.: 2010-N02121, published 2010.*
Japanese Office Action dated Apr. 5, 2010, from corresponding Japanese Application No. 2010-271255.

*Primary Examiner* — Kiley Stoner
(74) *Attorney, Agent, or Firm* — Katten Muchin Rosenman LLP

(57) ABSTRACT

A terminal of a compact wire loop with a great strength of bonding is formed by a method including: a first folding step in which a tip end of a capillary is raised by a height of $H_1$ from a point 86a where the center of the capillary is positioned during second bonding on a lead 74 to a point "p", and then moved horizontally by a first distance of $L_1$ toward a pad 73, and lowered to a point "r"; a second folding step in which the tip end of the capillary is raised from the point "r" to a height of $H_2$ and then moved horizontally toward the lead 74 by a second distance of $L_2$; and a third bonding step in which the center of the capillary is aligned with and then lowered to a point 87a on the lead 74 adjacent to the point 86a.

3 Claims, 24 Drawing Sheets

FOREIGN PATENT DOCUMENTS

| | | |
|---|---|---|
| JP | 2005-123388 | 5/2005 |
| JP | 2005-142314 | 6/2005 |
| JP | 2005-159267 | 6/2005 |
| JP | 2007-329283 | 12/2007 |
| JP | 2008-98549 | 4/2008 |
| JP | 2008-135559 | 6/2008 |

* cited by examiner

METHOD OF MANUFACTURING SEMICONDUCTOR DEVICE AND WIRE BONDING APPARATUS

BACKGROUND OF THE INVENTION

1. Field of the Invention

The present invention relates to a method of manufacturing a semiconductor device including a wire loop to be formed by wire bonding, and to a structure of a wire bonding apparatus for use in the method.

2. Description of the Related Art

In semiconductor manufacturing processes, wire bonding apparatuses are often used for bonding of thin metallic wires to electrode pads on a semiconductor chip and electrode leads on a lead frame for connection therebetween. Many wire bonding apparatuses include a bonding arm configured to be rotated with a drive motor, an ultrasonic horn attached to the bonding arm, a capillary attached at one end of the ultrasonic horn, and an ultrasonic vibrator attached to the ultrasonic horn. In such wire bonding apparatuses, the bonding arm is driven and rotated to move the capillary in a direction toward and away from a pad or lead and to bond an initial ball formed at a tip end of the capillary or a wire to the pad or lead, and then the ultrasonic horn is resonated with the ultrasonic vibrator to provide ultrasonic vibration at the tip end of the capillary for bonding.

For wire connection between a pad and a lead using such a wire bonding apparatus, a method is generally employed in which a wire extending out of the tip end of the capillary is first formed into an initial ball and the initial ball is bonded onto the pad, and then the capillary is raised to loop and bond the wire onto the lead, thereafter the wire is raised together with the capillary and cut off (see FIGS. 5 and 6 of Japanese Patent No. 3830485, for example). The method for wire connection between a pad and a lead provides a sufficient strength of bonding between the pad and wire because the initial ball is bonded to the pad. However, the strength of bonding between the lead and wire can not be sufficient because only a lateral face of the wire is bonded to the lead.

To address this problem, there has been proposed a method in which after a wire is bonded to a lead, the capillary is raised toward a pad while the wire is fed out, and then the wire is re-bonded at a position farther from the pad than the position where first bonded to the lead, thereafter the wire is raised together with the capillary and cut off (see FIG. 2 of Japanese Patent No. 3830485, for example). There has also been proposed a method in which after a wire is bonded to a lead, the capillary is raised and lowered to be brought into contact with the lead at a position farther from a pad than the position where first bonded to the lead to apply ultrasonic vibration thereto (see FIG. 4 of Japanese Patent No. 4365851, for example).

However, in the related art described in Japanese Patent No. 3830485, since the wire is bonded to the lead to form a wire loop and then the capillary is moved while the wire is fed out to form a second small wire loop on the opposite side of the lead with respect to the pad, it is necessary for stable formation of the second wire loop to increase the wire feed length, so that the wire is likely to be formed into a loop shape. Thus increasing the wire feed length will result in an increase in the size of the second wire loop and thereby require the lead to have an increased area for bonding, suffering from a problem of increase in the size of the semiconductor device. Also, in the related art described in Japanese Patent No. 4365851, since the capillary is brought into contact with the lead at a position farther from a pad than the position where first bonded to the lead, it is necessary for the lead to have an increased length, suffering from a problem of inadequacy in manufacturing a compact semiconductor device.

BRIEF SUMMARY OF THE INVENTION

It is hence an object of the present invention to provide a compact wire loop with a great strength of bonding.

The present invention is directed to a method of manufacturing a semiconductor device having a wire loop connecting a first bonding point and a second bonding point using a wire bonding apparatus having a load sensor for detecting pressing load applied at a tip end of a capillary, the method including: a first bonding step; a second bonding step; a first folding step; a second folding step; a third bonding step; the first bonding step of bonding a wire fed out of a tip end of a capillary to a first bonding point by means of the capillary; the second bonding step of, after completing the first bonding step, bonding the wire to a second bonding point by means of the capillary in such a manner that the capillary is raised while feeding the wire out of the tip end thereof and subsequently looped toward the second bonding point along a predetermined trajectory and subsequently lowered to bond the second bonding point with a face portion located at the first bonding point side of the capillary, thereby forming a wire loop between the first bonding point and the second bonding point; the first folding step of, after completing the second bonding step, folding the wire to the wire loop by means of the capillary in such a manner that the capillary is raised in a substantially vertical direction while feeding the wire out of the tip end thereof and subsequently moved in a substantially horizontal direction and toward the first bonding point by a first predetermined distance, and then the capillary is lowered in a substantially vertical direction and to the wire loop until the pressing load detected with the load sensor becomes equal to a predetermined value, thereby forming the wire fed out of the tip end of the capillary into a first folded portion having a shape that follows the upper face on the wire loop; the second folding step of, after completing the first folding step, folding the wire to the first folded portion by means of the capillary in such a manner that the capillary is raised in a substantially vertical direction while further feeding the wire out of the tip end thereof and subsequently moved away from the first bonding point by a second predetermined distance, and then the capillary is substantially lowered in a substantially vertical direction, thereby forming the wire further fed out of the tip end of the capillary into a second folded portion having a shape that follows the upper face on the first folded portion; and the third bonding step of, after completing the second folding step, bonding the wire by means of the capillary in such a manner that the capillary is further lowered in a substantially vertical direction and toward immediately adjacent to a bonded portion where the wire has bonded to the second bonding point, thereby bonding the wire thereto while causing a face portion located at the first bonding point side of the capillary to crush at least a portion of the first and second folded portions located at the second bonding point side so as to be overlapped on the wire loop located at the second bonding point side.

The method of manufacturing a semiconductor device according to the present invention can preferably be arranged such that the pressing load in the first folding step is for bringing the first folded portion into contact with the upper face on the wire loop.

The present invention is also directed to a wire bonding apparatus including a capillary for bonding a first bonding point and a second bonding point with a wire, the apparatus including: a capillary; a load sensor for detecting pressing load applied at a tip end of the capillary; a movement mechanism for moving the capillary in X, Y, and Z directions; and a control unit for outputting a command signal to the movement mechanism, the control unit including: first bonding means; second bonding means; first folding means; second folding means; third bonding means; the first bonding means for bonding a wire fed out of a tip end of a capillary to a first bonding point by means of the capillary; the second bonding means for, after completing the first bonding, bonding the wire to a second bonding point by means of the capillary in such a manner that the capillary is raised while feeding the wire out of the tip end thereof and subsequently looped toward the second bonding point along a predetermined trajectory and subsequently lowered to bond the second bonding point with a face portion located at the first bonding point side of the capillary, thereby forming a wire loop between the first bonding point and the second bonding point; the first folding means for, after completing the second bonding, folding the wire to the wire loop by means of the capillary in such a manner that the capillary is raised in a substantially vertical direction while feeding the wire out of the tip end thereof and subsequently moved in a substantially horizontal direction and toward the first bonding point by a first predetermined distance, and then the capillary is lowered in a substantially vertical direction and to the wire loop until the pressing load detected with the load sensor becomes equal to a predetermined value, thereby forming the wire fed out of the tip end of the capillary into a first folded portion having a shape that follows the upper face on the wire loop; the second folding means for, after completing the first folding, folding the wire to the first folded portion by means of the capillary in such a manner that the capillary is raised in a substantially vertical direction while further feeding the wire out of the tip end thereof and subsequently moved away from the first bonding point by a second predetermined distance, and then the capillary is substantially lowered in a substantially vertical direction, thereby forming the wire further fed out of the tip end of the capillary into a second folded portion having a shape that follows the upper face on the first folded portion; and the third bonding means for, after completing the second folding, bonding the wire by means of the capillary in such a manner that the capillary is further lowered in a substantially vertical direction and toward immediately adjacent to a bonded portion where the wire has bonded to the second bonding point, thereby bonding the wire thereto while causing a face portion located at the first bonding point side of the capillary to crush at least a portion of the first and second folded portions located at the second bonding point side so as to be overlapped on the wire loop located at the second bonding point side.

The wire bonding apparatus according to the present invention can preferably be arranged such that the pressing load used in the first folding means is for bringing the first folded portion into contact with the upper face of the wire loop.

The present invention is further directed to a method of manufacturing a semiconductor device having a wire loop connecting a first bonding point and a second bonding point by a wire bonding apparatus having capillary, the method including: a first bonding step; a second bonding step; a first trampling bonding step; a third folding step; a second trampling bonding step; the first bonding step of bonding a wire fed out of a tip end of a capillary to a first bonding point by means of the capillary; the second bonding step of, after completing the first bonding step, bonding the wire to a second bonding point by means of the capillary in such a manner that the capillary is raised while feeding the wire out of the tip end thereof and subsequently looped toward the second bonding point along a predetermined trajectory and subsequently lowered to bond the second bonding point with a face portion located at the first bonding point side of the capillary, thereby forming a wire loop between the first bonding point and the second bonding point; the first trampling bonding step of, after completing the second bonding step, trampling the wire to the wire loop by means of the capillary in such a manner that the capillary is raised in a substantially vertical direction while feeding the wire out of the tip end thereof and subsequently moved in a substantially horizontal direction and toward the first bonding point by a first predetermined distance, and then the capillary is lowered in a substantially vertical direction and onto the wire loop and a bonded portion where the wire has bonded to the second bonding point to bond the wire fed out of the tip end of the capillary, thereby forming a first trampled portion while folding and trampling thereon; the third folding step of, after completing the first trampling bonding step, folding the wire to the first trampled portion by means of the capillary in such a manner that the capillary is raised in a substantially vertical direction while further feeding the wire out of the tip end thereof and subsequently moved away from the first bonding point by a second predetermined distance, and then the capillary is substantially lowered in a substantially vertical direction, thereby forming the wire further fed out of the tip end of the capillary into a third folded portion having a shape that follows the upper face on the first trampled portion; and the second trampling bonding step of, after completing the third folding step, bonding the wire by means of the capillary in such a manner that the capillary is further lowered in a substantially vertical direction and toward immediately adjacent to the bonded portion where the wire has bonded to the second bonding point, thereby bonding the wire thereon while causing a face portion located at the first bonding side of the capillary to trample at least a portion of the third folded portion located at the second bonding point side so as to be overlapped onto the first trampled portion.

In the method of manufacturing a semiconductor device according to the present invention, the first trampling bonding step can preferably be arranged such that the wire fed out of the tip end of the capillary is folded onto the wire loop and the portion where the wire has bonded to the second bonding point, and trampled until a portion of the surface thereof is made into a flat.

In the method of manufacturing a semiconductor device according to the present invention, the second trampling bonding step can preferably be arranged such that at least a portion of the third folded portion located at the second bonding point side is trampled onto the first trampled portion with the face portion located at the first bonding point side of the capillary until a portion of the surface thereof is made into a flat.

The method of manufacturing a semiconductor device according to the present invention can preferably be arranged such that the capillary is configured to be vibrated ultrasonically, and that in the first bonding step, second bonding step, first trampling bonding step, and second trampling bonding step, the capillary is vibrated ultrasonically during bonding operation.

The method of manufacturing a semiconductor device according to the present invention can preferably further include a wire cutoff step of, after the second trampling bonding step, raising the capillary with the wire in a substantially vertical direction while clamping the wire with a clamper, thereby cutting off the wire.

The present invention is also directed to a wire bonding apparatus including a capillary for bonding a first bonding point and a second bonding point with a wire, the apparatus including: a capillary; a movement mechanism for moving the capillary in X, Y, and Z directions; and a control unit for outputting a command signal to the movement mechanism, the control unit including: first bonding means; second bonding means; first trampling bonding means; third folding means; second trampling bonding means; the first bonding means for bonding a wire fed out of a tip end of a capillary to a first bonding point by means of the capillary; the second bonding means for, after completing the first bonding, bonding the wire to a second bonding point by means of the capillary in such a manner that the capillary is raised while feeding the wire out of the tip end thereof and subsequently looped toward the second bonding point along a predetermined trajectory and subsequently lowered to bond the second bonding point with a face portion located at the first bonding point side of the capillary, thereby forming a wire loop between the first bonding point and the second bonding point; the first trampling bonding means for, after completing the second bonding, trampling the wire loop to the wire loop by means of the capillary in such a manner that the capillary is raised in a substantially vertical direction while feeding the wire out of the tip end thereof and subsequently moved in a substantially horizontal direction and toward the first bonding point by a first predetermined distance, and then the capillary is lowered in a substantially vertical direction and onto the wire loop and a bonded portion where the wire has bonded to the second bonding point to bond the wire fed out of the tip end of the capillary, thereby forming a first trampled portion while folding and trampling thereon; the third folding means for, after completing the first trampling bonding, folding the wire to the first trampled portion by means of the capillary in such a manner that the capillary is raised in a substantially vertical direction while further feeding the wire out of the tip end thereof and subsequently moved away from the first bonding point by a second predetermined distance, and then the capillary is substantially lowered in a substantially vertical direction, thereby forming the wire further fed out of the tip end of the capillary into a third folded portion having a shape that follows the upper face on the first trampled portion; and the second trampling bonding means for, after completing the third folding, bonding the wire by means of the capillary in such a manner that the capillary is further lowered in a substantially vertical direction and toward immediately adjacent to the bonded portion where the wire has bonded to the second bonding point, thereby bonding the wire thereto while causing a face portion located at the first bonding side of the capillary to trample at least a portion of the third folded portion located at the second bonding point side so as to be overlapped onto the first trampled portion.

The present invention offers the advantage of providing a compact wire loop with a great strength of bonding.

BRIEF DESCRIPTION OF THE SEVERAL VIEWS OF THE DRAWINGS

Exemplary embodiments of the present invention will be described in detail based on the following figures, wherein.

DETAILED DESCRIPTION OF THE INVENTION

Figure 1:
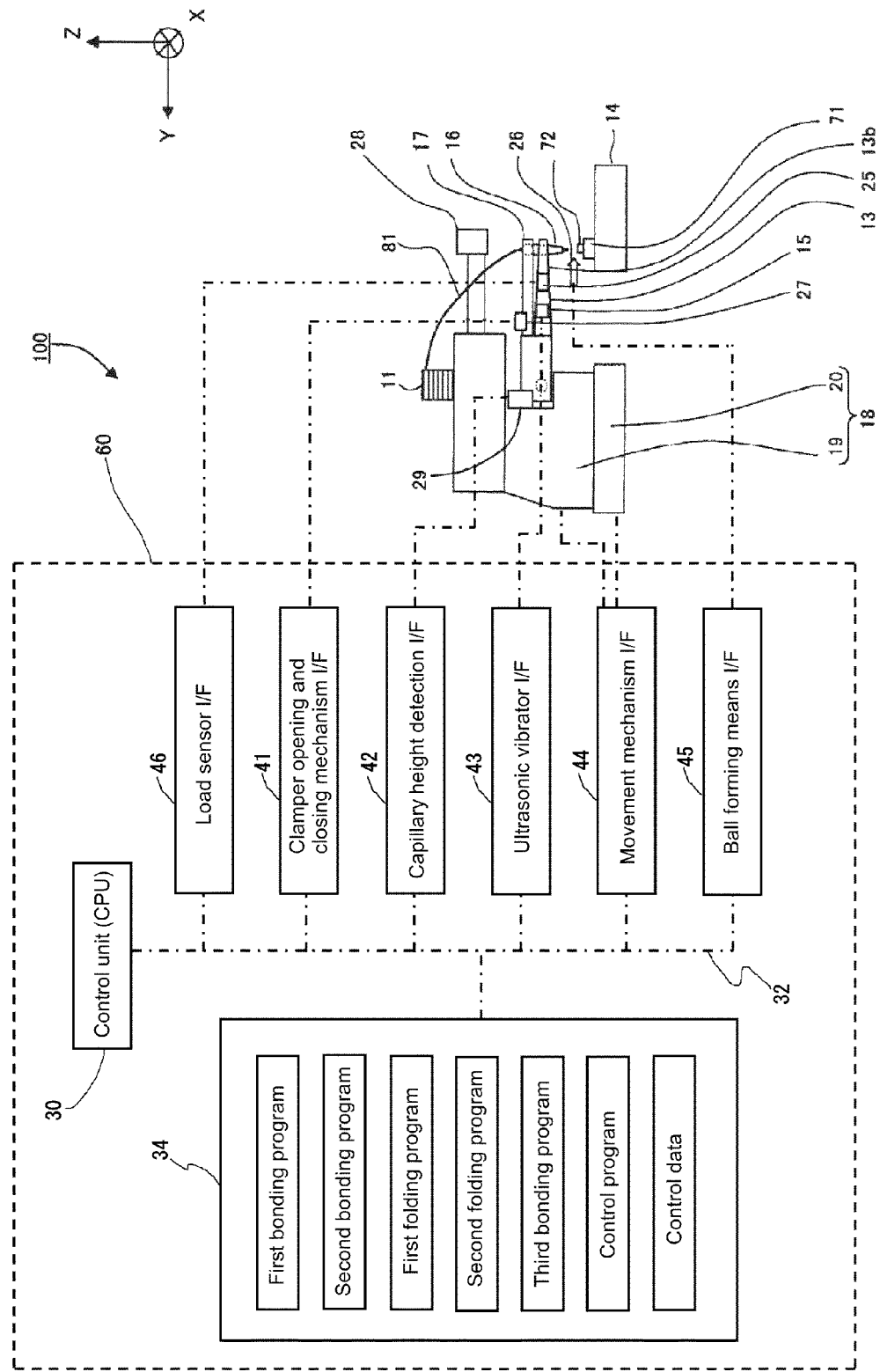
FIG. 1 is a systematic diagram illustrating the configuration of a wire bonding apparatus according to an exemplary embodiment of the present invention.

A wire bonding apparatus 10 according to an exemplary embodiment of the present invention will hereinafter be described in detail with reference to the accompanying drawings. In FIG. 1, each alternate long and short dash line represents a signal line. As shown in FIG. 1, the wire bonding apparatus 10 includes a bonding head 19 placed on an XY table 20 and a bonding arm 13 attached to the bonding head 19. The bonding arm 13 is configured to be driven and rotated about a center of rotation with a Z-directional motor and has an ultrasonic horn 13b attached at a leading end thereof, and a front end of the ultrasonic horn 13b is configured to move arcuately toward and away from a pad surface of a semiconductor chip 72 serving as a bonding surface. Also the front end of the ultrasonic horn 13b is configured to move vertically in the Z direction in the vicinity of (immediately adjacent to) the pad surface of the semiconductor chip 72 or the surface of a lead frame 71. At the front end of the ultrasonic horn 13b, there is attached a capillary 16 serving as a bonding tool. The XY table 20 and the bonding head 19 configure a movement mechanism 18 in which the bonding head 19 can be moved freely with the XY table 20 within a plane (XY plane) lying along the bonding surface, whereby driving the bonding arm 13 attached to the movement mechanism 18 using the Z-directional motor allows the front end of the ultrasonic horn 13b that is attached at the leading end of the bonding arm 13 and the capillary 16 attached at the front end of the ultrasonic horn 13b to be moved freely in the X, Y, and Z directions. On the leading end side of the bonding arm 13 with respect to the XY table 20, there is provided a bonding stage 14 for sucking and fixing the lead frame 71 thereto.

Figure 2:
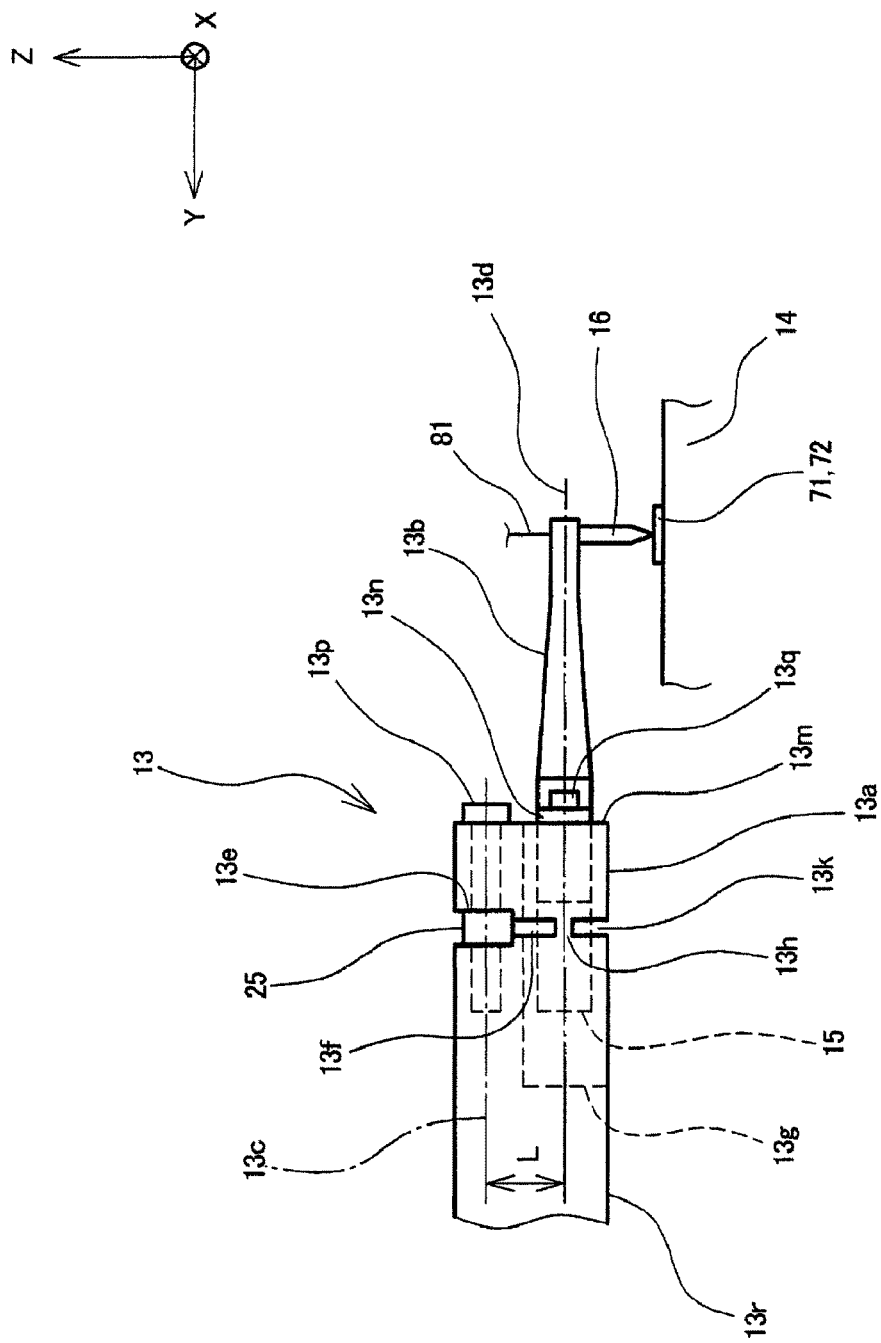
FIG. 2 illustrates a state of a load sensor installed in the wire bonding apparatus according to an exemplary embodiment of the present invention.

As shown in FIG. 2, the bonding arm 13 has an approximately rectangular parallelepiped shape extending in a direction along the central axis 13d of the ultrasonic horn 13, and has a front end portion 13a including a flange mounting surface 13m and a rear end portion 13r including a center of rotation (not shown). In a portion of the bonding arm 13 closer to (located at the side of) the bonding stage 14, there is provided a recess 13g for housing therein an ultrasonic vibrator 15 to be connected to the ultrasonic horn 13b. A flange 13n is provided at a node of the vibration of the ultrasonic horn 13b and fixed using a bolt 13q to the flange mounting surface 13m in the front end portion 13a. The front and rear end portions 13a and 13r are connected via a thin plate-like connection 13h provided at a height position (in the Z direction) including the central axis 13d of the ultrasonic horn 13b. Between the front and rear end portions 13a and 13r of the bonding arm 13, narrow slits 13f and 13k are formed, respectively, on the side of the bonding stage 14 and its opposite side with respect to the connection 13h. In a Z-directional upper portion of the bonding arm 13 farther from the bonding stage 14, there is provided a groove 13e for fitting a load sensor 25 therein. The groove 13e is provided in an opposed manner between the front and rear end portions 13a and 13r of the bonding arm 13. The load sensor 25 fitted in the groove 13e is sandwiched in between the front and rear end portions 13a and 13r of the bonding arm 13 and pressurized using screws 13p inserted through the front end portion 13a into the rear end portion 13r. The central axis 13c of the load sensor 25 is offset from the central axis 13d of the ultrasonic horn 13b by a distance of L in the Z direction.

As shown in FIG. 1, the capillary 16 has an opened cylindrical structure with a conical tip end and has a central wire hole through which a wire 81 made of gold or the like can be inserted. The wire 81 is supplied from a spool 11 mounted on the bonding head 19. The ultrasonic horn 13b has a feature of providing ultrasonic energy generated at the ultrasonic vibrator 15 to the capillary 16 to press and bond the wire 81 inserted through the capillary 16 to the pad surface of the semiconductor chip 72 serving as a bonding surface and a lead on the lead frame 71. In the vicinity of (immediately adjacent to) the bonding stage 14, there is provided a discharge torch 26 for heating and forming a wire extending out of the tip end of the capillary 16 into an initial ball.

The bonding head 19 is provided with a clamper 17 for clamping and releasing the wire 81 inserted through the capillary 16. The clamper 17 is configured to move in the X, Y, and Z directions in conjunction with the bonding arm 13. The wire bonding apparatus 10 includes a clamper opening and closing mechanism 27, and the clamper 17 is configured to be opened and closed by the operation of the clamper opening and closing mechanism 27.

As shown in FIG. 1, the wire bonding apparatus 10 includes a control unit 30 having a CPU built-in to detect the position and control the operation of each component for connection between the semiconductor chip 72 and the lead frame 71 with the wire 81. The XY table 20 is provided with XY position detecting means for detecting the XY position of the bonding head 19. Also, the bonding head 19 is provided with capillary height detecting means 29 for detecting the angle of rotation of the bonding arm 13 about the center of rotation to detect the Z-directional height of the tip end of the capillary 16. The capillary height detecting means 29 can not detect the angle of rotation, but can directly detect the position of the leading end of the bonding arm 13 or the tip end of the capillary 16. The capillary height detecting means 29 can also be either contactless or contact type.

A camera 28 is attached to the bonding head 19 as imaging means for acquiring images of the semiconductor chip 72, lead frame 71, etc. The bonding head 19 is configured to position the capillary 16 in the X and Y directions based on images acquired using the camera 28. The camera 28 can include only an imaging element and a lens with no aperture or shutter mechanism as long as capable of acquiring image signals.

Detection signals from the capillary height detecting means 29 and the load sensor 25 are configured to be fed to the control unit 30, respectively, via a capillary height detection interface 42 and a load sensor interface 46 through a data bus 32 connected to the control unit 30. Also, the movement mechanism 18, which is configured with the XY table 20 and the bonding head 19, clamper opening and closing mechanism 27, ultrasonic vibrator 15, and discharge torch 26 are connected through the data bus 32 to the control unit 30, respectively, via a movement mechanism interface 44, a clamper opening and closing mechanism interface 41, an ultrasonic vibrator interface 43, and a ball forming means interface 45. These components are each configured to operate based on a command from the CPU-built-in control unit 30.

A storage unit 34 is connected to the data bus 32. The storage unit 34, which holds control data required for position detecting processing and control command output operations performed by the control unit 30, is configured to output control data to the control unit 30 based on a command from the control unit 30 and to store and hold signal data fed therein. The control unit 30, data bus 32, storage unit 34, and interfaces 41 to 46 integrally configure a computer 60. The storage unit 34 stores therein not only control data but also control programs for overall bonding control, a first bonding program serving as first bonding means, a second bonding program serving as second bonding means, a first folding program serving as first folding means, a second folding program serving as second folding means, and a third bonding program serving as third bonding means.

Figure 4A:
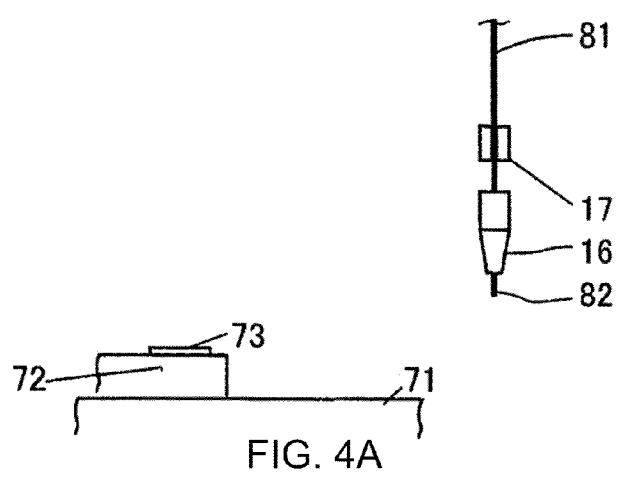
FIG. 4A illustrates an operation of a first bonding step in a method of manufacturing a semiconductor device according to an exemplary embodiment of the present invention.

Next will be described a process for manufacturing a semiconductor device through a wire bonding operation by the thus arranged wire bonding apparatus 10. The control unit 30 first retrieves the overall control programs, first bonding program, second bonding program, first folding program, second folding program, third bonding program, and control data, which are stored in the storage unit 34, to store in its built-in memory. As shown in FIG. 4A, in an initial state, a tail wire 82 extends out of the tip end of the capillary 16 and the clamper 17 is closed.

Figure 3:
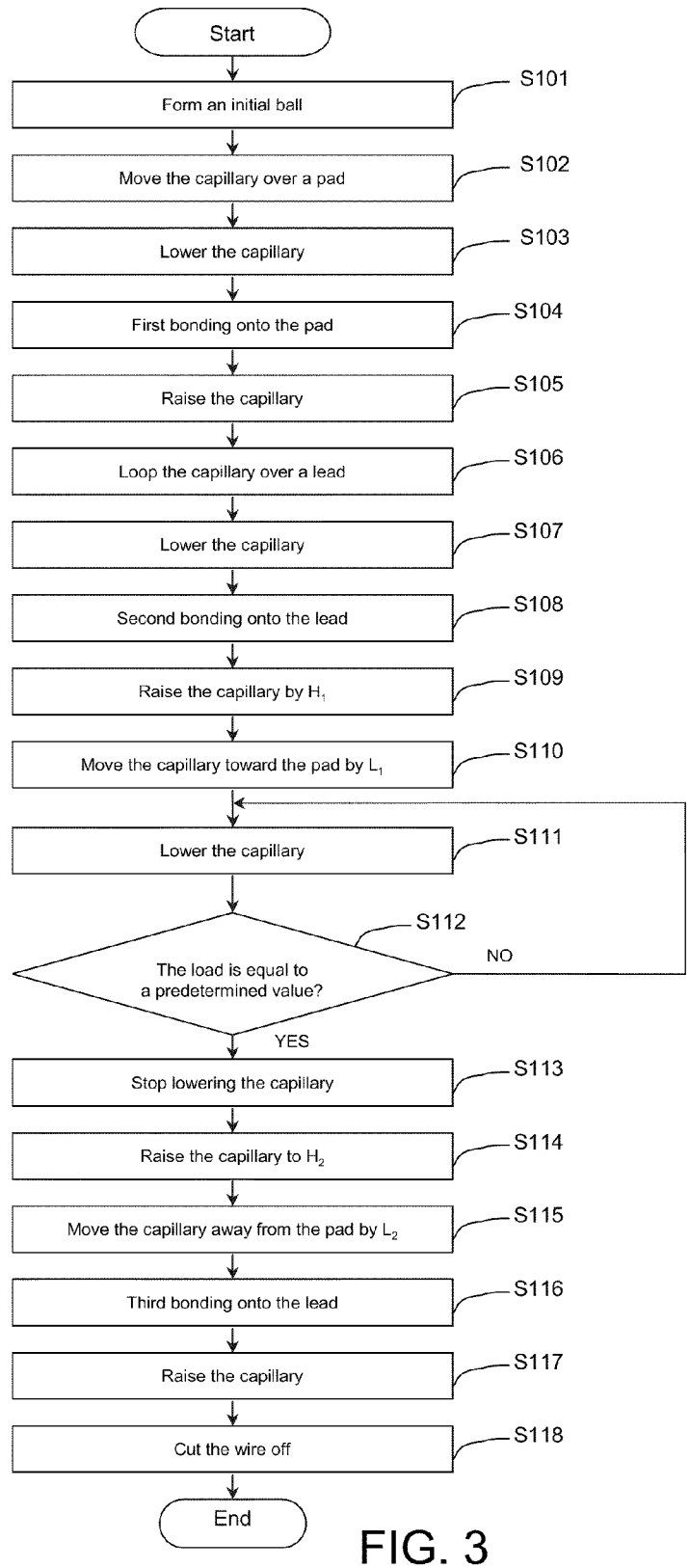
FIG. 3 is a flow chart illustrating an operation of the wire bonding apparatus according to an exemplary embodiment of the present invention.
Figure 4B:
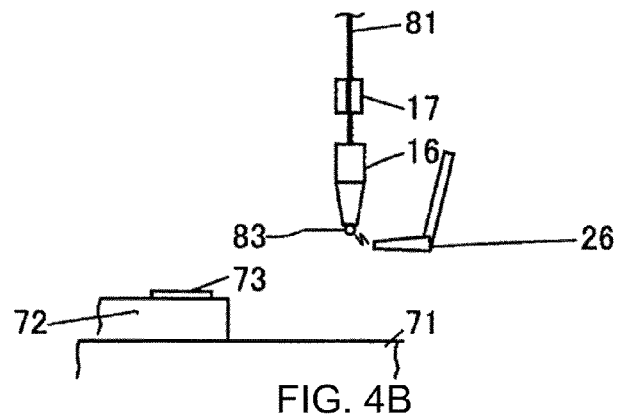
FIG. 4B illustrates another operation of the first bonding step in the method of manufacturing a semiconductor device according to an exemplary embodiment of the present invention.

As indicated by Step S101 in FIG. 3, the control unit 30 issues a command to form an initial ball. Based on this command, a signal from the movement mechanism interface 44 is output to the XY table 20. The XY table 20 then moves the bonding head 19 to cause the tip end of the capillary 16 to come in the vicinity of (immediately adjacent to) the discharge torch 26. When the capillary 16 comes in the vicinity of (immediately adjacent to) the discharge torch 26, a discharge is formed between the discharge torch 26 and the tail wire 82 extending out of the tip end of the capillary 16 based on a signal from the ball forming means interface 45, so that the tail wire 82 is formed into a spherical initial ball 83, as shown in FIG. 4B.

Figure 4C:
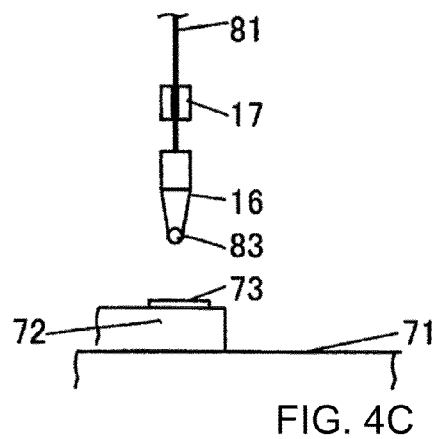
FIG. 4C illustrates still another operation of the first bonding step in the method of manufacturing a semiconductor device according to an exemplary embodiment of the present invention.

As indicated by Step S102 in FIG. 3 and shown in FIG. 4C, the control unit 30 issues a command to move the capillary 16 over a pad 73 on the semiconductor chip 72 serving as a first bonding point. Based on this command, a signal from the movement mechanism interface 44 is output to the XY table 20. The XY table 20 then moves the bonding head 19 to cause the center of the capillary 16 to come just above the pad 73.

Figure 4D:
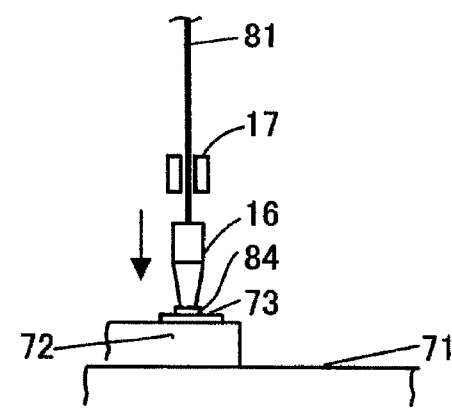
FIG. 4D illustrates a further operation of the first bonding step in the method of manufacturing a semiconductor device according to an exemplary embodiment of the present invention.

The control unit 30 then performs a first bonding step. As indicated by Step S103 in FIG. 3, the control unit 30 issues a command to lower the capillary 16. Based on this command, a signal from the movement mechanism interface 44 is output to the bonding head 19. The Z-directional motor installed in the bonding head 19 is then driven to rotate the bonding arm 13 and thereby lower the tip end of the capillary 16 on the pad 73. Also based on this command, a signal from the clamper opening and closing mechanism interface 41 is output to the clamper opening and closing mechanism 27. The clamper opening and closing mechanism 27 then opens the clamper 17. As indicated by Step S104 in FIG. 3 and shown in FIG. 4D, the initial ball 83 formed at the tip end of the capillary 16 is pressed onto the pad 73 and, based on a signal from the ultrasonic vibrator interface 43, the ultrasonic vibrator 15 is driven to vibrate the capillary 16 and to bond the initial ball 83 onto the pad 73 as a bonded ball 84 (first bonding).

Figure 4E:
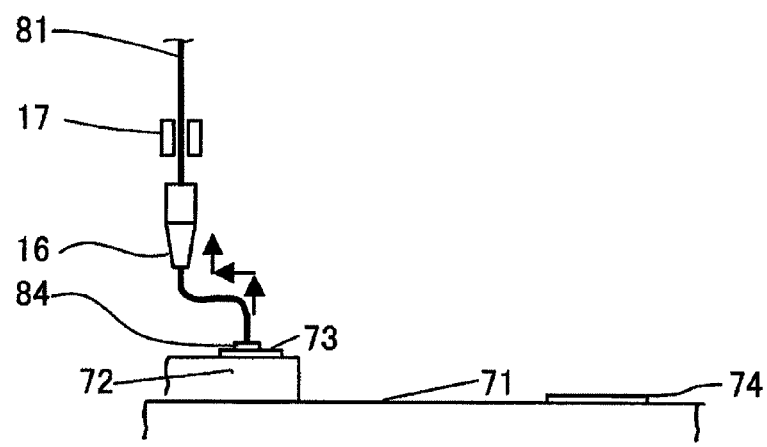
FIG. 4E illustrates an operation of a second bonding step in the method of manufacturing a semiconductor device according to an exemplary embodiment of the present invention.

Following the first bonding step, the control unit 30 performs a second bonding step. As indicated by Step S105 in FIG. 3, the control unit 30 issues a command to raise the capillary 16 with the clamper 17 being opened. Based on this command, a signal from the movement mechanism interface 44 is output to the bonding head 19. The Z-directional motor installed in the bonding head 19 is then driven to rotate the bonding arm 13 and thereby raise the tip end of the capillary 16 from the pad 73, as shown in FIG. 4E. At the same time, the signal from the movement mechanism interface 44 is output to the XY table 20. The capillary 16 then moves horizontally away from a lead 74 on the lead frame 71 by a predetermined distance. Thereafter, the capillary 16 is further raised to a predetermined height. In this case, since the clamper 17 is opened, the wire 81 is fed out of the tip end of the capillary 16.

Figure 4F:
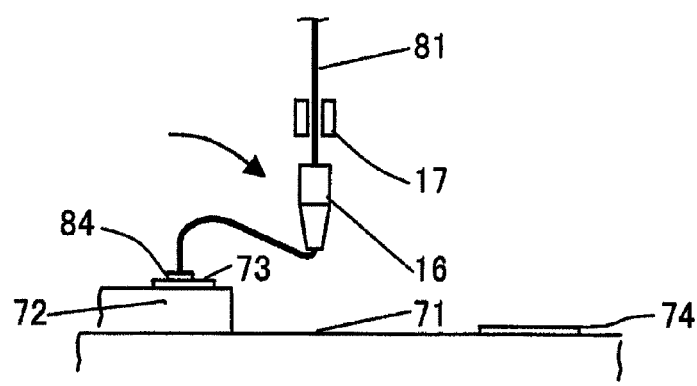
FIG. 4F illustrates another operation of the second bonding step in the method of manufacturing a semiconductor device according to an exemplary embodiment of the present invention.

When the capillary 16 is raised to the predetermined height, the control unit 30 issues a command to loop the capillary 16 to a point over the lead 74 serving as a second bonding point with the clamper 17 being opened, as indicated by Step S106 in FIG. 3. Based on this command, a signal from the movement mechanism interface 44 is output to the bonding head 19 and the XY table 20. As shown in FIG. 4F, the capillary 16 then moves toward the lead 74 in a looped manner along a predetermined locus (trajectory). Also during this looping, since the clamper 17 is opened, the wire 81 is fed out of the tip end of the capillary 16. The predetermined locus (trajectory) here means a triangular loop, trapezoidal loop, M-shaped loop locus (trajectory), or the like.

Figure 4G:
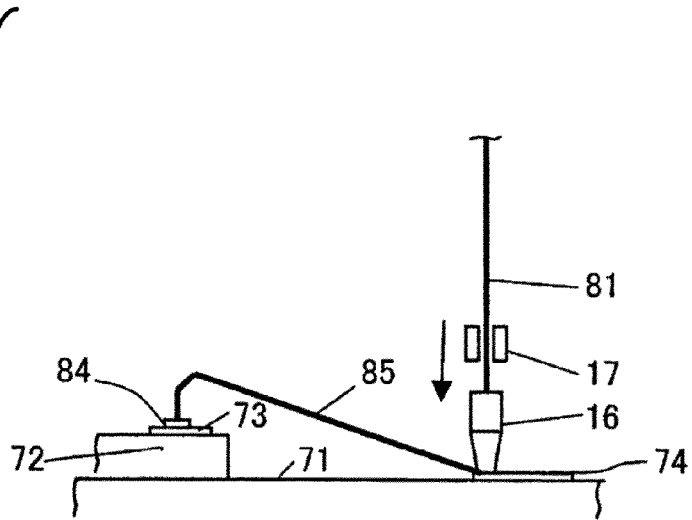
FIG. 4G illustrates still another operation of the second bonding step in the method of manufacturing a semiconductor device according to an exemplary embodiment of the present invention.

When the capillary 16 comes over the lead 74, the control unit 30 issues a command to lower the capillary 16, as indicated by Step S107 in FIG. 3. Based on this command, a signal from the movement mechanism interface 44 is output to the bonding head 19. The Z-directional motor installed in the bonding head 19 is then driven to rotate the bonding arm 13 and thereby lower the tip end of the capillary 16 on the lead 74. As indicated by Step S108 in FIG. 3 and shown in FIG. 4G, the wire 81 is pressed against the lead 74 with the tip end of the capillary 16 and, based on a signal from the ultrasonic vibrator interface 43, the ultrasonic vibrator 15 is driven to vibrate the capillary 16 and to bond the wire 81 onto the lead 74 (second bonding). The second bonding forms a wire loop 85 for connection between the pad 73 serving as the first bonding point and the lead 74 serving as the second bonding point, as shown in FIG. 4G.

Following the formation of the wire loop 85, the control unit 30 performs a first folding step. As indicated by Step S109 in FIG. 3 and shown in FIG. 4H, the control unit 30 issues a command to raise the capillary 16 by a height of $H_1$ with the clamper 17 being opened. Based on this command, a signal from the movement mechanism interface 44 is output to the bonding head 19. The Z-directional motor installed in the bonding head 19 is then driven to rotate the bonding arm 13 and thereby raise the capillary 16. The control unit 30 acquires a signal from the capillary height detecting means 29 via the capillary height detection interface 42 to monitor if the tip end of the capillary 16 is raised to the height $H_1$. If it is determined based on the signal from the capillary height detecting means 29 that the tip end of the capillary 16 is raised to the height $H_1$, the control unit 30 then stops raising the capillary 16. In this case, since the clamper 17 is opened, the wire 81 is fed out of the tip end of the capillary 16.

Figure 4H:
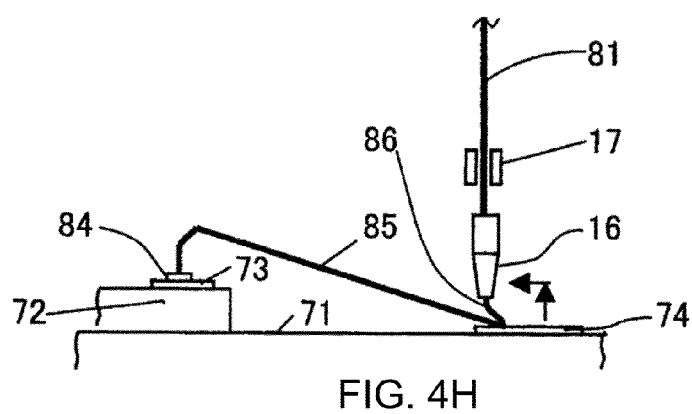
FIG. 4H illustrates an operation of a first folding step in the method of manufacturing a semiconductor device according to an exemplary embodiment of the present invention.

As indicated by Step S110 in FIG. 3 and shown in FIG. 4H, the control unit 30 then issues a command to move the capillary 16 horizontally toward the pad 73 by a first distance of $L_1$. Based on this command, a signal from the movement mechanism interface 44 is output to the XY table 20. The XY table 20 then moves the capillary 16 toward the pad 73. The control unit 30 localizes the capillary 16 based on a signal from the XY position detecting means provided in the XY table 20 for detection of the XY position of the bonding head 19 to monitor if the capillary 16 is moved by the first distance $L_1$. If it is determined that the capillary 16 is moved by the first distance $L_1$, the control unit 30 then stops moving the capillary 16 horizontally. When the horizontal movement of the capillary 16 is stopped, the wire fed out of the tip end of the capillary 16 is formed in a first folded portion 86 folded from the lead 74 toward the pad 73.

Figure 4J:
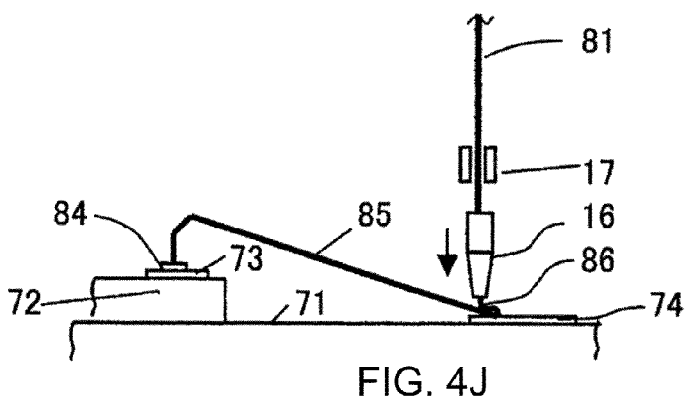
FIG. 4J illustrates another operation of the first folding step in the method of manufacturing a semiconductor device according to an exemplary embodiment of the present invention.
Figure 5:
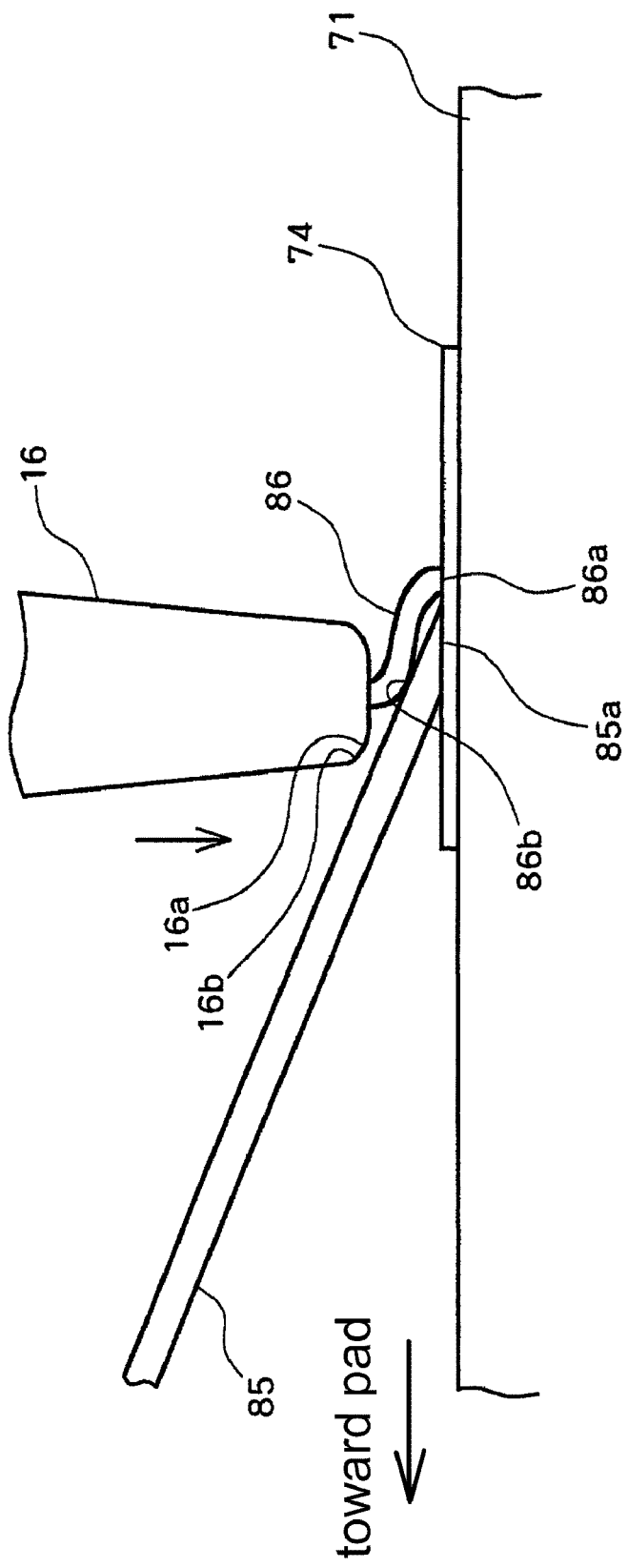
FIG. 5 illustrates the vicinity of a lead during an operation of the first folding step in the method of manufacturing a semiconductor device according to an exemplary embodiment of the present invention.

As indicated by Step S111 in FIG. 3 and shown in FIG. 4J, the control unit 30 issues a command to lower the capillary 16. Based on this command, a signal from the movement mechanism interface 44 is output to the bonding head 19. The Z-directional motor installed in the bonding head 19 is then driven to rotate the bonding arm 13 and thereby start to lower the capillary 16. When the capillary 16 is lowered, the pressing load on the capillary 16 increases gradually due to the force of repulsion by the first folded portion 86. The control unit 30 acquires the pressing load on the capillary 16 based on a signal from the load sensor 25. When the capillary 16 is further lowered, the lower face of the first folded portion 86 is brought into contact with the upper face of the wire loop 85, as shown in FIG. 5. This causes the pressing load on the capillary 16 to further increase. Then, as indicated by Step S112 in FIG. 3, when the pressing load detected with the load sensor 25 becomes equal to a predetermined value, the control unit 30 issues a command to stop lowering the capillary, as indicated by Step S113 in FIG. 3. Based on this command, the lowering of the capillary 16 is stopped and the first folding step is completed.

As shown in FIG. 5, in the state where the lowering of the capillary 16 is stopped, the first folded portion 86 is in contact with the upper face of the wire loop 85, which extends obliquely downward to the bonded portion 85a where bonded to the lead 74, and presses the wire loop 85 downward, so that the pressing load detected with the load sensor 25 becomes equal to the predetermined value. The wire loop 85 is slightly pressed downward, but approximately maintains its original shape. The first folded portion 86 extends in an S-shaped arc along the upper face of the wire loop 85 from the point 86a where the center of the capillary 16 is positioned during the second bonding of the wire 81 to the lead 74 toward the pad 73, and further extends in a bent manner from the contact point 86b with the wire loop 85 toward the capillary 16 above. Also, in this exemplary embodiment, neither the face portion 16a nor the outer radius portion 16b at the tip end of the capillary 16 is in contact with the wire loop 85.

Following the first folding step, the control unit 30 performs a second folding step. As indicated by Step S114 in FIG. 3 and shown in FIG. 4K, the control unit 30 issues a command to raise the tip end of the capillary 16 to a height of $H_2$ with the clamper 17 being opened. Based on this command, a signal from the movement mechanism interface 44 is output to the bonding head 19. The Z-directional motor installed in the bonding head 19 is then driven to rotate the bonding arm 13 and thereby raise the capillary 16. The control unit 30 acquires a signal from the capillary height detecting means 29 via the capillary height detection interface 42 to monitor if the tip end of the capillary 16 is raised to the height $H_2$. If it is determined based on the signal from the capillary height detecting means 29 that the tip end of the capillary 16 is raised to the height $H_2$, the control unit 30 then stops raising the capillary 16. In this case, since the clamper 17 is opened, the wire 81 is fed out of the tip end of the capillary 16.

Figure 4K:
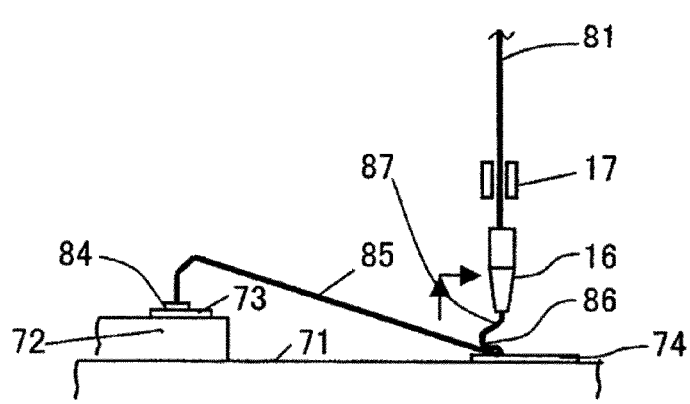
FIG. 4K illustrates an operation of a second folding step in the method of manufacturing a semiconductor device according to an exemplary embodiment of the present invention.
Figure 6:
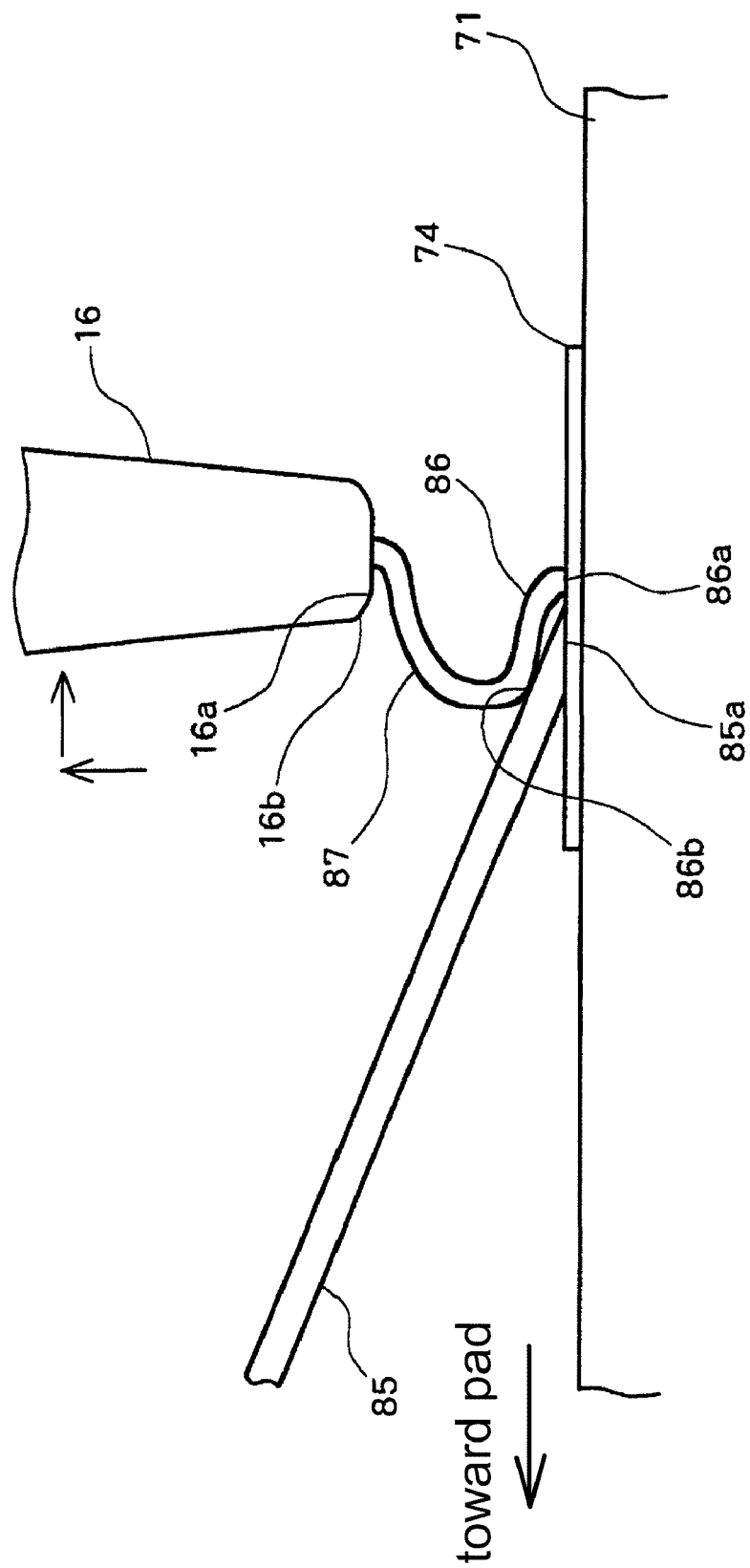
FIG. 6 illustrates the vicinity of the lead during an operation of the second folding step in the method of manufacturing a semiconductor device according to an exemplary embodiment of the present invention.

As indicated by Step S115 in FIG. 3 and shown in FIG. 4K, the control unit 30 issues a command to move the capillary 16 horizontally away from the pad 73 by a second distance of $L_2$ that is greater than the first distance $L_1$ of the horizontal movement in the first folding step. Based on this command, a signal from the movement mechanism interface 44 is output to the XY table 20. The XY table 20 then moves the capillary 16 away from the pad 73, that is, toward the lead 74. The control unit 30 localizes the capillary 16 based on a signal from the XY position detecting means provided in the XY table 20 for detection of the XY position of the bonding head 19 to monitor if the capillary 16 is moved by the second distance $L_2$. If it is determined that the capillary 16 is moved by the second distance $L_2$, the control unit 30 then stops moving the capillary 16 horizontally. When the horizontal movement of the capillary 16 is stopped, the wire fed out of the tip end of the capillary 16 is formed in a second folded portion 87 folded from the first folded portion 86 toward the lead 74, as shown in FIG. 6. Since the second distance $L_2$ of the horizontal movement of the capillary 16 is greater than the first distance $L_1$ in the first folding step, in the state where the horizontal movement of the capillary 16 is stopped, the center of the capillary 16 is on the opposite side of the pad 73 with respect to the contact point 86a of the first folded portion 86 with the lead 74 where the center of the capillary 16 is positioned during the second bonding, as shown in FIG. 6. That is, the center of the capillary 16 is positioned beyond the bonded portion 85a at the second bonding point.

Figure 7:
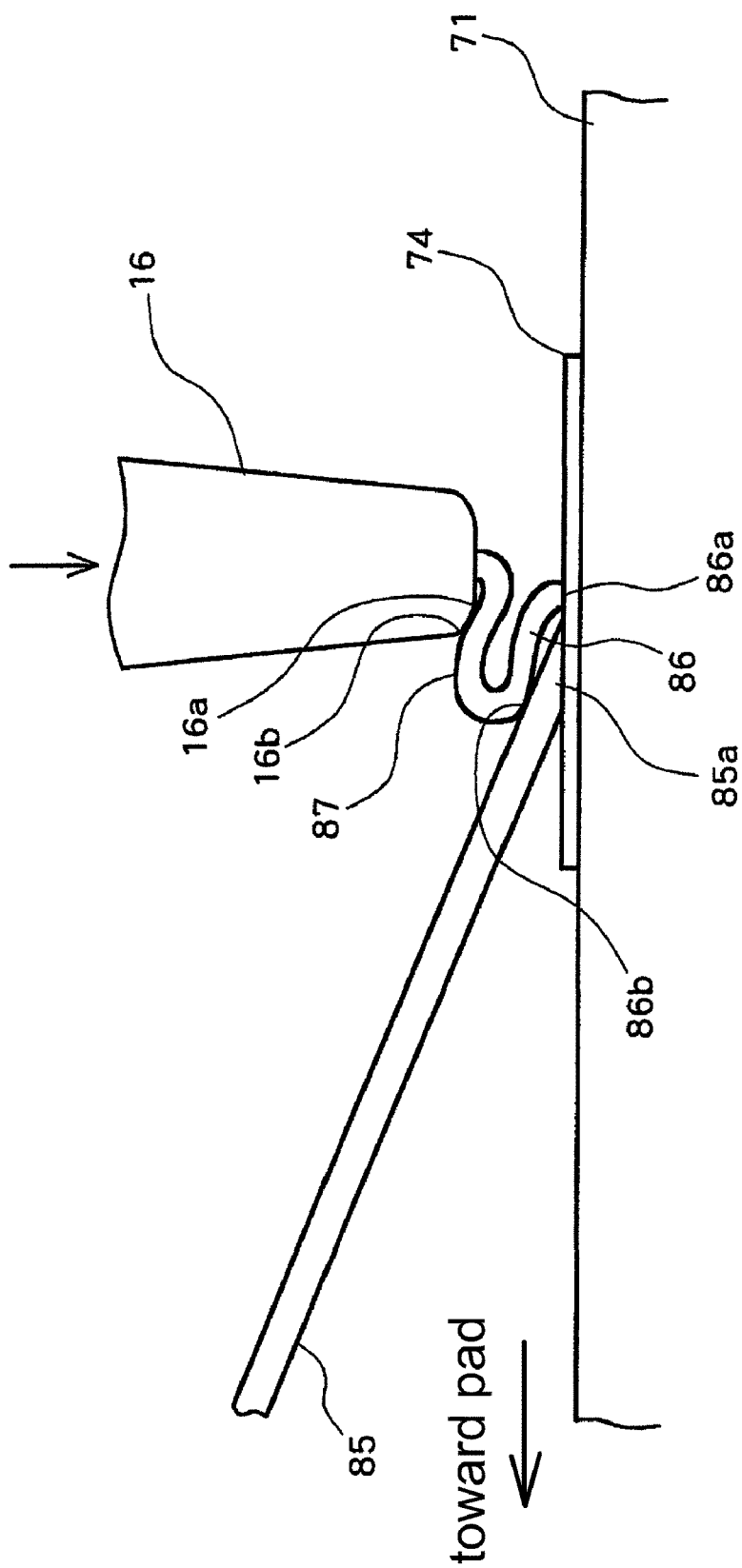
FIG. 7 illustrates the vicinity of the lead during another operation of the second folding step in the method of manufacturing a semiconductor device according to an exemplary embodiment of the present invention.

As indicated by Step S116 in FIG. 3, the control unit 30 issues a command to perform a third bonding step. Based on this command, a signal from the movement mechanism interface 44 is output to the bonding head 19. The Z-directional motor installed in the bonding head 19 is then driven to rotate the bonding arm 13 and thereby start to lower the capillary 16. When the capillary 16 is lowered, the second folded portion 87 is bent to be overlaid on the first folded portion 86, as shown in FIG. 7. Then the face portion 16a or the outer radius portion 16b of the capillary 16 closer to (located at the side of) the pad 73 comes into contact with a lateral face of the second folded portion 87, as shown in FIG. 7. Thus, the second folded portion 87 is further folded with the face portion 16a or the outer radius portion 16b.

Figure 4L:
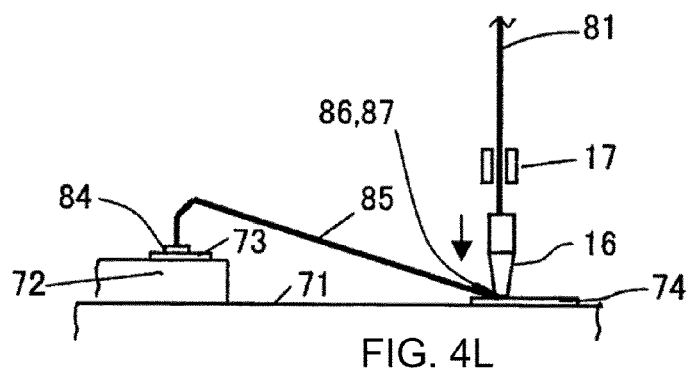
FIG. 4L illustrates an operation of a third bonding step in the method of manufacturing a semiconductor device according to an exemplary embodiment of the present invention.
Figure 8:
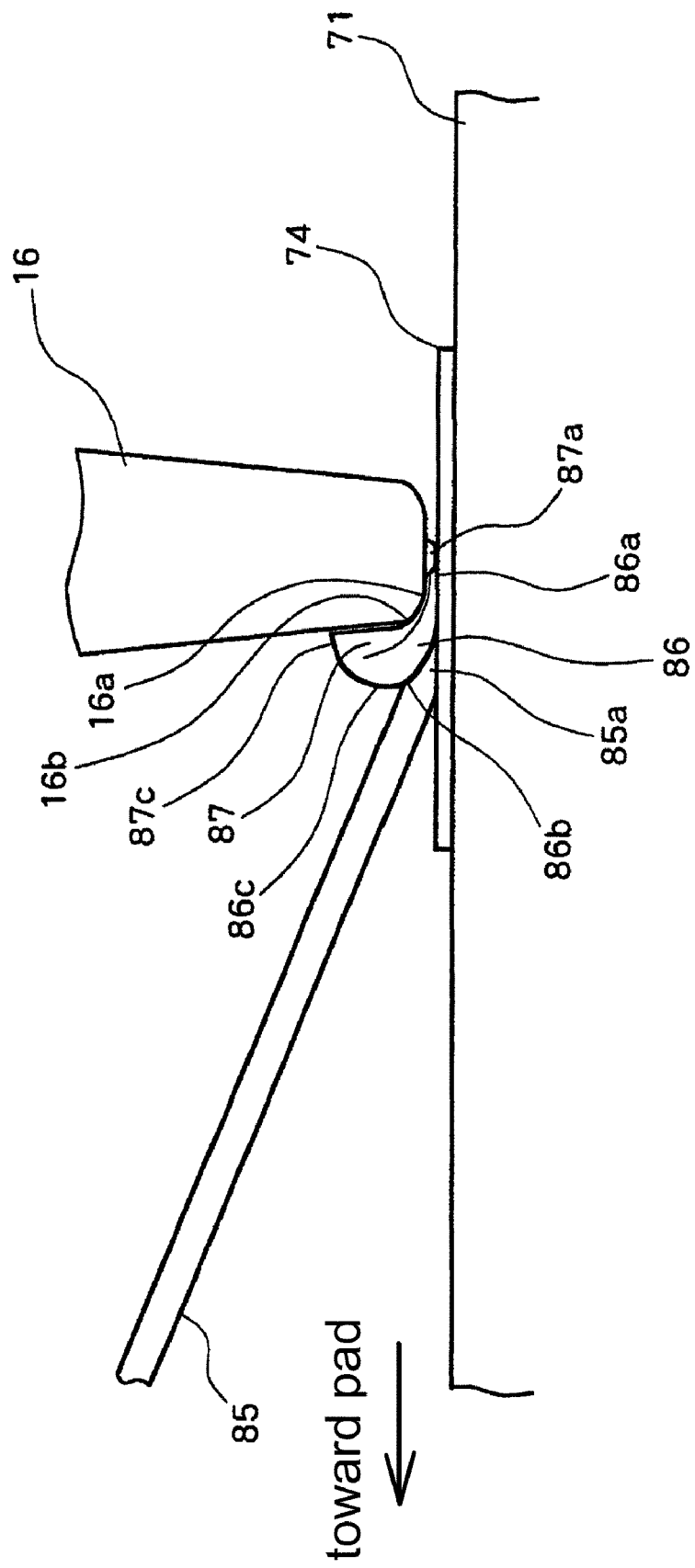
FIG. 8 illustrates the vicinity of the lead during an operation of the third bonding step in the method of manufacturing a semiconductor device according to an exemplary embodiment of the present invention.

As shown in FIGS. 4L and 8, when the capillary 16 is further lowered, the face portion 16a and the outer radius portion 16b of the capillary 16 closer to (located at the side of) the pad 73 press and deform the first and second folded portions 86 and 87, so that the upper faces of the portions are shaped according to the face portion 16a and the outer radius portion 16b of the capillary 16. At the same time, the end portions of the first and second folded portions 86 and 87 farther from the pad 73 are bonded to a point 87a on the lead 74 adjacent to the point 86a in such a manner that a portion of the first and second folded portions 86 and 87 is overlaid on the bonded portion 85a of the wire loop 85 where bonded to the lead 74. After the first and second folded portions 86 and 87 are bonded to the lead 74, the third bonding step is completed.

After the third bonding step, the control unit 30 issues a command to raise the capillary 16 with the clamper 17 being opened, as indicated by Step S117 in FIG. 3. Based on this command, a signal from the movement mechanism interface 44 is output to the bonding head 19. The Z-directional motor installed in the bonding head 19 is then driven to rotate the bonding arm 13 and thereby raise the capillary 16. In this case, since the clamper 17 is opened, the wire 81 is fed out of the tip end of the capillary 16.

Figure 4M:
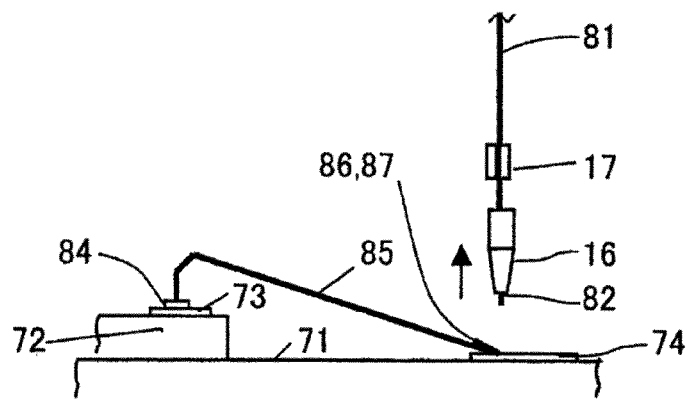
FIG. 4M illustrates a wire cutoff operation in the method of manufacturing a semiconductor device according to an exemplary embodiment of the present invention.
Figure 9:
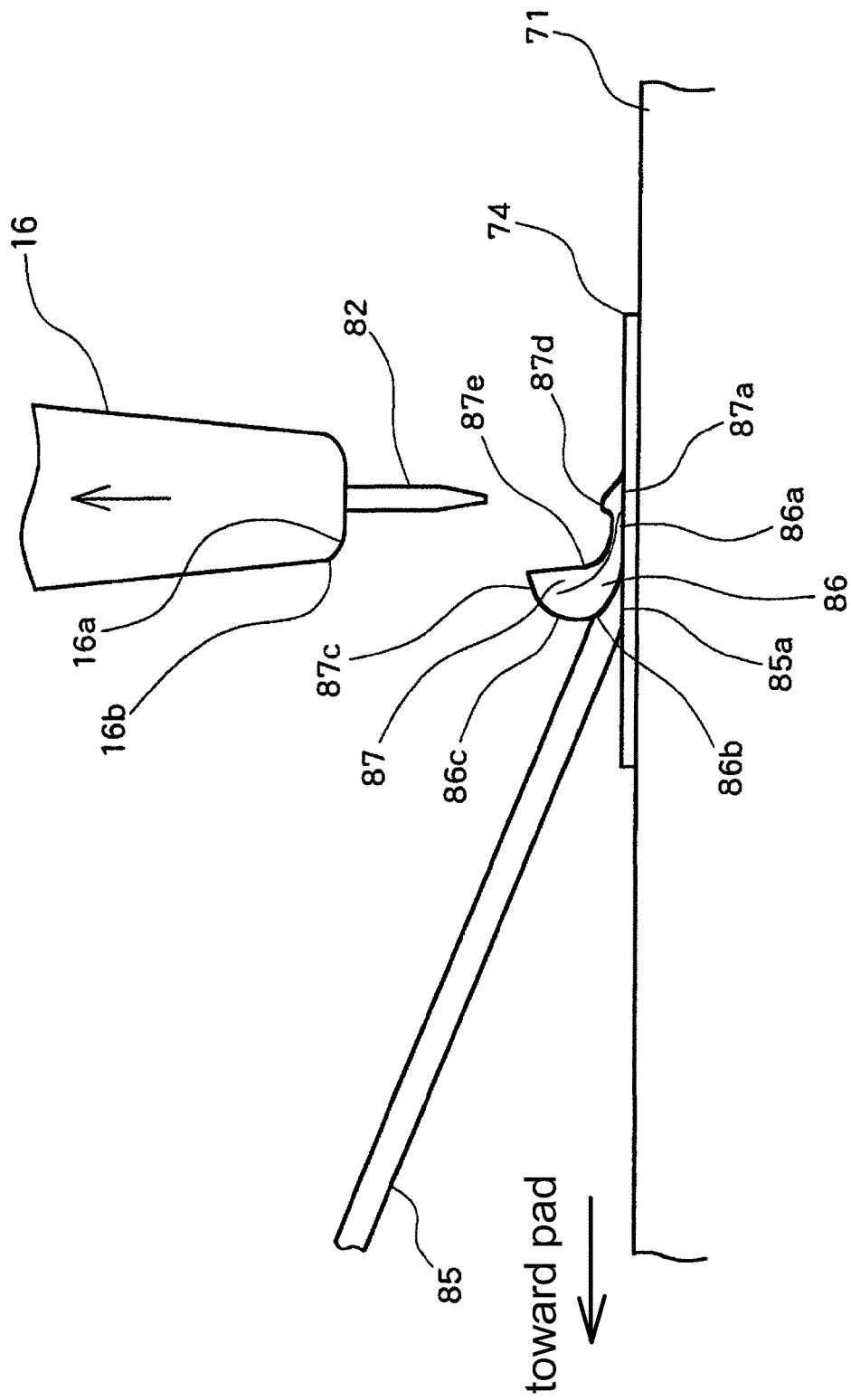
FIG. 9 illustrates the vicinity of the lead during a wire cutoff operation in the method of manufacturing a semiconductor device according to an exemplary embodiment of the present invention.

After the capillary 16 is raised by a predetermined distance, the control unit 30 issues a wire cutoff command, as indicated by Step S118 in FIG. 3. Based on this command, a signal from the clamper opening and closing mechanism interface 41 is output to the clamper opening and closing mechanism 27. The clamper opening and closing mechanism 27 then closes the clamper 17. When the capillary 16 is further raised with the clamper 17 being closed, the wire 81 is cut off, as shown in FIGS. 4M and 9, to be a state where a tail wire 82 extends out of the tip end of the capillary 16. Also, at the point 87a on the lead 74 where the center of the capillary 16 is positioned during the third bonding, there is formed a roundly raised wire cutoff residual 87d.

Figure 10:
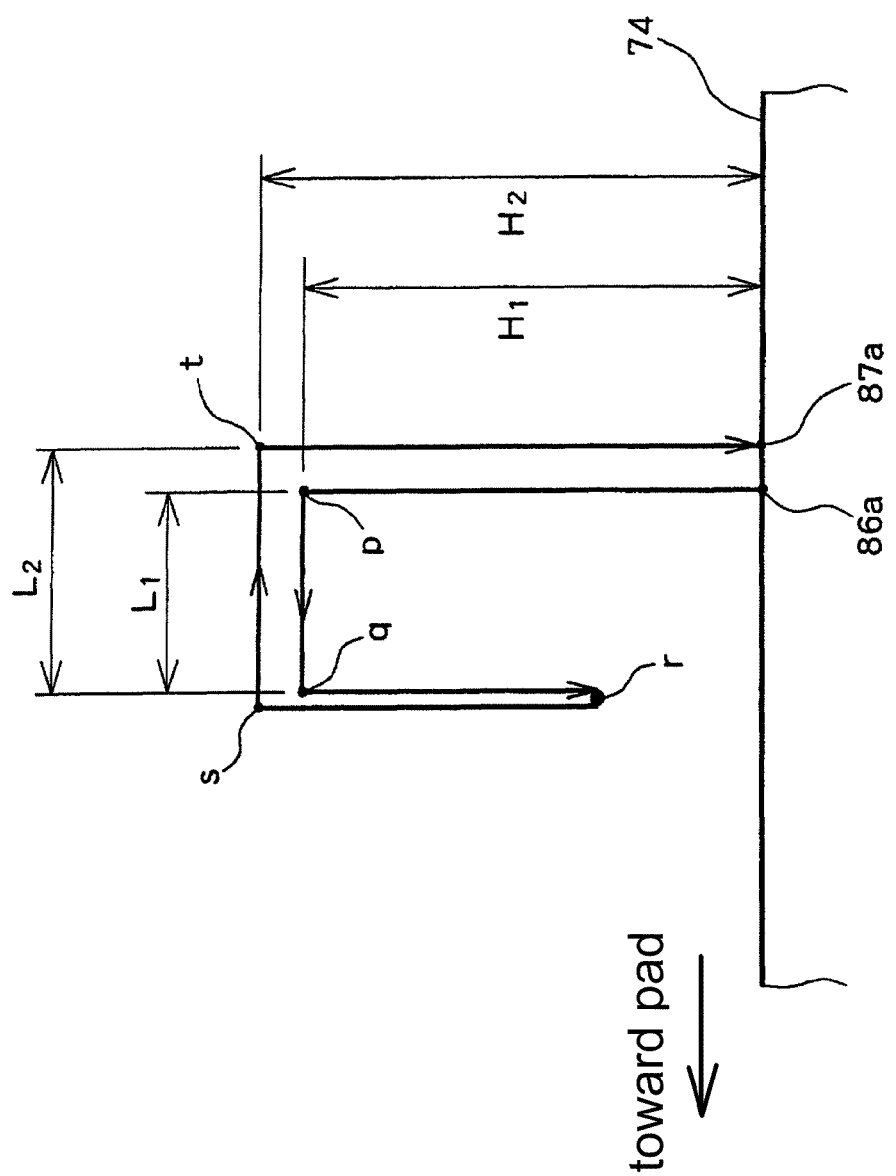
FIG. 10 illustrates a movement locus of a capillary in the method of manufacturing a semiconductor device according to an exemplary embodiment of the present invention.

FIG. 10 schematically illustrates the locus (trajectory) of the tip end of the capillary 16 through the first and second folding steps and the third bonding step described above. As shown in FIG. 10, in the first folding step, the tip end of the capillary 16 is raised by the height $H_1$ from the point 86a where the center of the capillary 16 is positioned during the second bonding on the lead 74 to the point "p", and then moved horizontally by the first distance $L_1$ toward the pad 73, and lowered to the point "r" where the load detected with the load sensor 25 becomes equal to the predetermined value. In the second folding step, the tip end of the capillary 16 is raised from the point "r" to the height $H_2$, and then moved horizontally away from the pad 73, that is, toward the lead 74 by the second distance $L_2$, which is slightly greater than the first distance $L_1$. In the third bonding step, the center of the capillary 16 is aligned with the point 87a adjacent to the point 86a on the opposite side of the pad 73 with respect to the point 86a, and then lowered to the point 87a on the lead 74.

Figure 11:
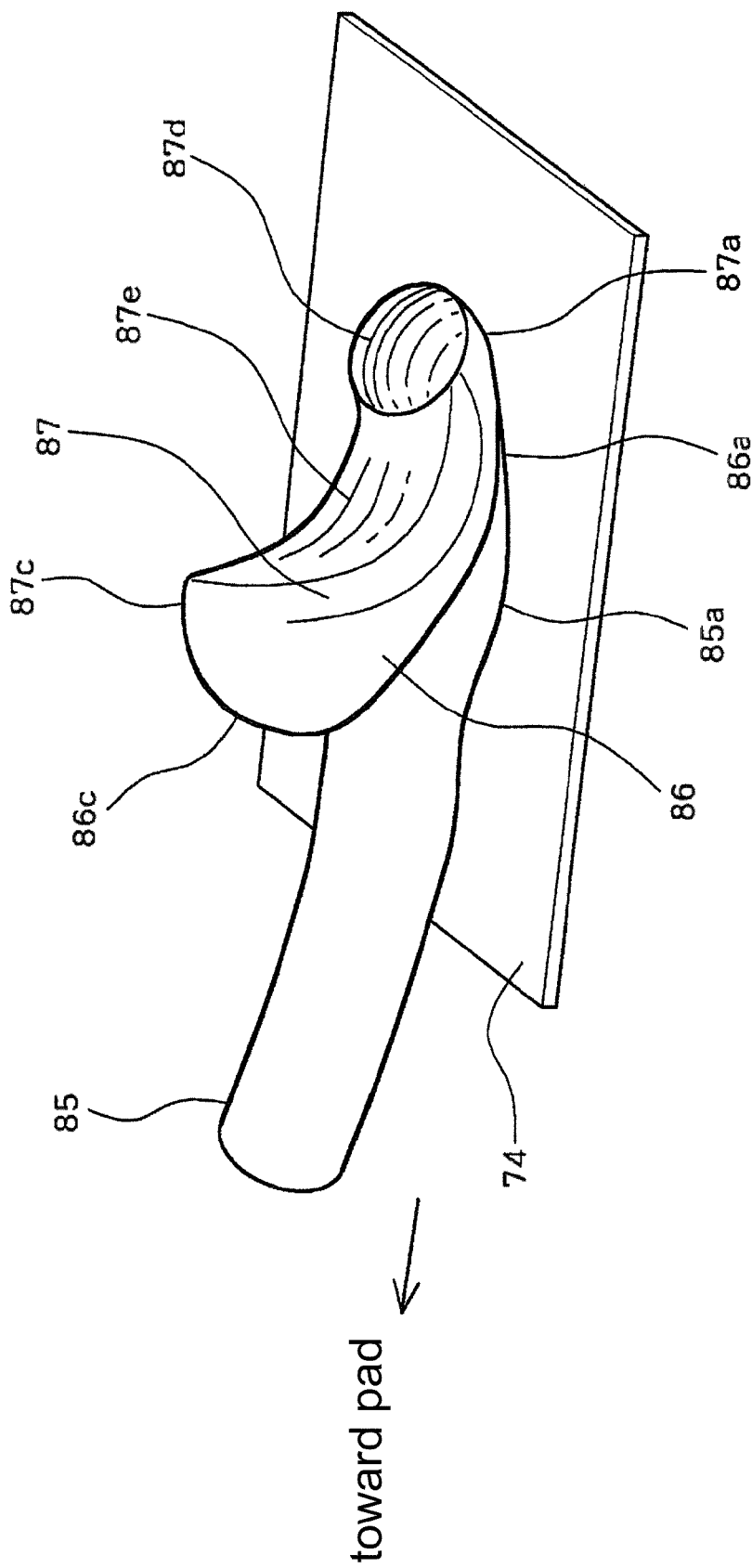
FIG. 11 is a perspective view illustrating a terminal of a wire loop closer to the lead according to an exemplary embodiment of the present invention.

FIG. 11 illustrates the shape of the terminal of the wire loop 85 closer to (located at the side of) the lead 74 formed through the above-described bonding operation. As shown in FIG. 11, the terminal closer to (located at the side of) the lead 74 is formed by the end portions of the first and second folded portions 86 and 87 farther from the pad 73 being pressed and deformed in an overlaid manner on the bonded portion 85a of the wire loop 85 where bonded to the lead 74. The surface of the end portions of the first and second folded portions 86 and 87 farther from the pad 73 is formed in a cylindrical recess 87e following the shape of the tip end of the capillary 16. The end portion of the recess 87e farther from the pad 73 is the roundly raised wire cutoff residual 87d. The first and second folded portions 86 and 87 extend in a roll-up manner from the wire cutoff residual 87d toward the pad 73, and the end portions 86c and 87c thereof closer to (located at the side of) the pad 73 are folded to be a round end.

As described heretofore, in this exemplary embodiment, the first and second folded portions 86 and 87 are bonded to the terminal of the wire loop 85 closer to (located at the side of) the lead 74 in an overlaid manner, whereby the strength of bonding between the wire loop 85 and the lead 74 is increased. Also, a portion of the first and second folded portions 86 and 87 is pressed and deformed with the tip end of the capillary on the bonded portion 85a of the wire loop 85 where bonded to the lead 74, resulting in a compact shape. At the same time, the first folded portion 86 can be folded to follow the shape of the wire loop 85, while maintaining the shape of the wire loop 85, by pressing the capillary 16 downward until the pressing load on the capillary 16 becomes equal to the predetermined value in the first folding step, whereby even a short wire can be formed reliably into a folded shape, the shape of the terminal of the compact wire loop 85 can be formed stably, and the thickness of the bonded portion where bonded to the lead 74 can be increased, which allows for preventing heel crack effectively.

Although the second distance $L_2$ of the horizontal movement is greater than the first distance $L_1$ of the horizontal movement in the first folding step in the above description of this exemplary embodiment, the second distance $L_2$ of the horizontal movement can be equal to or smaller than the first distance $L_1$ of the horizontal movement in the first folding step.

Next will be described another exemplary embodiment of the present invention with reference to FIGS. 12 to 21. Components identical to those in the exemplary embodiment described with reference to FIGS. 1 to 11 are designated by the same reference numerals to omit the description thereof.

Figure 12:
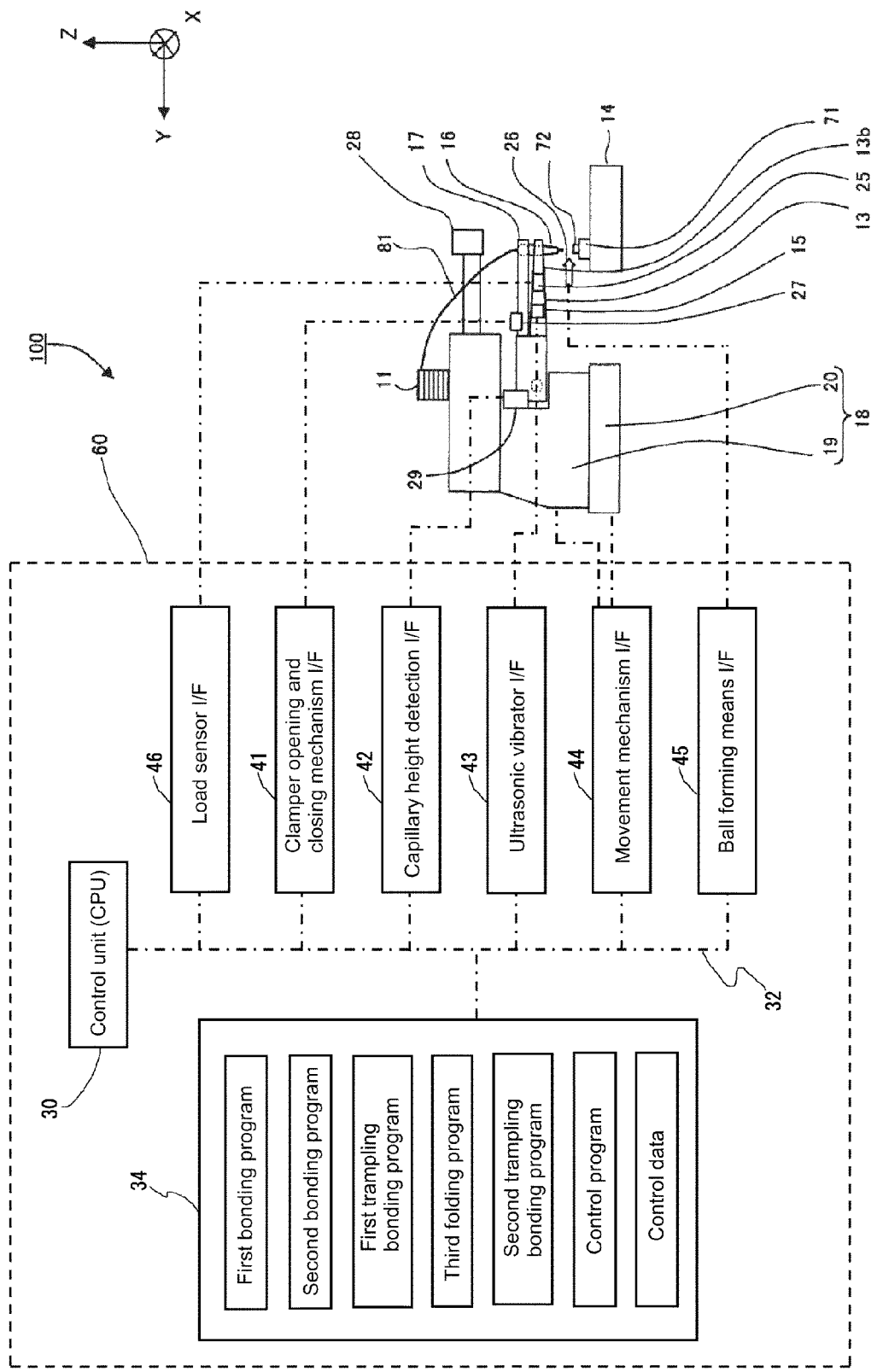
FIG. 12 is a systematic diagram illustrating the configuration of a wire bonding apparatus according to an exemplary embodiment of the present invention.

As shown in FIG. 12, unlike the wire bonding apparatus 10 described above with reference to FIG. 1, the storage unit 34 in the wire bonding apparatus 100 according to this exemplary embodiment stores therein not only control data but also control programs for overall bonding control, a first bonding program serving as first bonding means, a second bonding program serving as second bonding means, a first trampling bonding program serving as first trampling bonding means, a third folding program serving as third folding means, and a second trampling bonding program serving as second trampling bonding means. The other components are configured in the same manner as in the wire bonding apparatus 10 described with reference to FIG. 1.

Next will be described a process for manufacturing a semiconductor device through a wire bonding operation by the thus arranged wire bonding apparatus 100 according to this exemplary embodiment. The control unit 30 first retrieves the overall control programs, first bonding program, second bonding program, first trampling bonding program, third folding program, second trampling bonding program, and control data, which are stored in the storage unit 34, to store in its built-in memory. As shown in FIG. 4A, in an initial state, a tail wire 82 extends out of the tip end of the capillary 16 and the clamper 17 is closed. The first and second bonding steps shown in FIGS. 4A to 4G are the same as in the above-described exemplary embodiment, so the description thereof will be omitted to begin from the first trampling bonding step.

Figure 13:
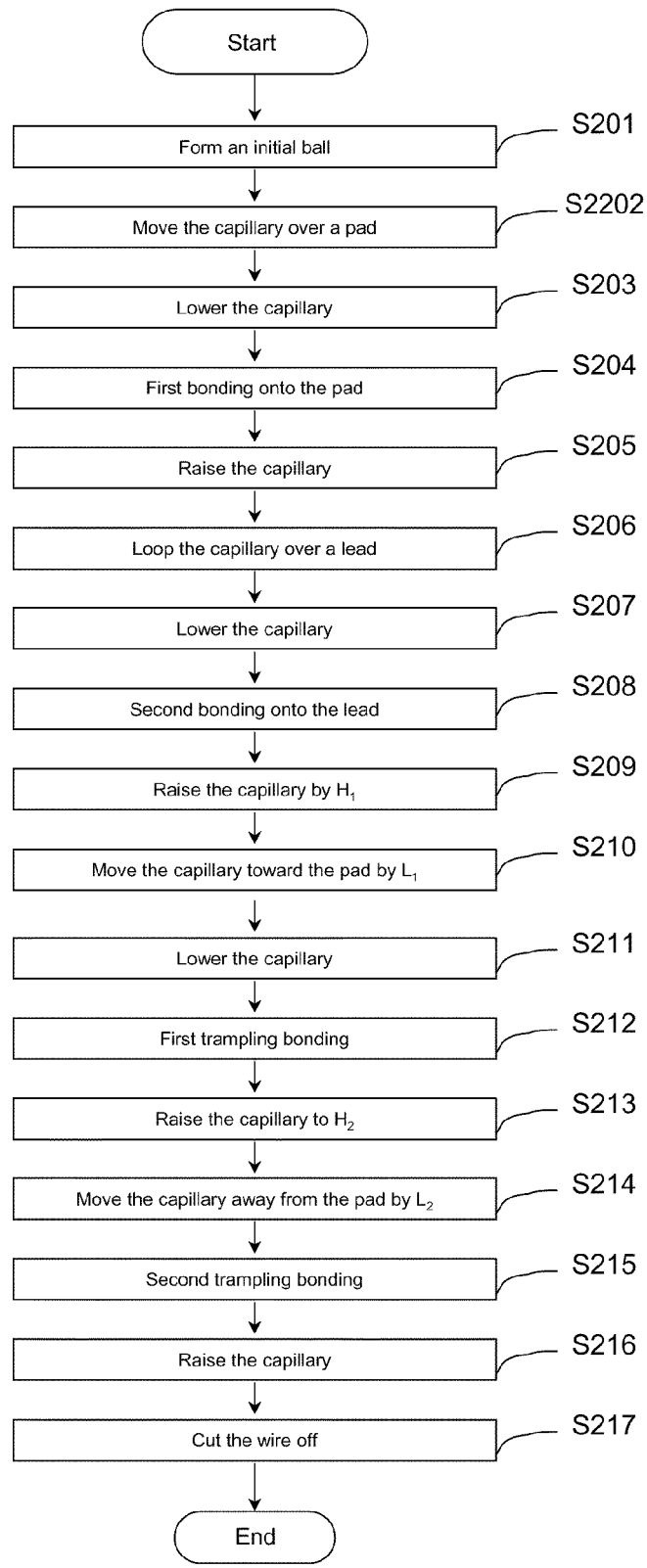
FIG. 13 is a flow chart illustrating an operation of the wire bonding apparatus according to an exemplary embodiment of the present invention.

As indicated by Step S209 in FIG. 13 and shown in FIG. 4H, the control unit 30 issues a command to raise the capillary 16 by a height of $H_1$ with the clamper 17 being opened in the first trampling bonding step. Based on this command, a signal from the movement mechanism interface 44 is output to the bonding head 19. The Z-directional motor installed in the bonding head 19 is then driven to rotate the bonding arm 13 and thereby raise the capillary 16. The control unit 30 acquires a signal from the capillary height detecting means 29 via the capillary height detection interface 42 to monitor if the tip end of the capillary 16 is raised to the height $H_1$. If it is determined based on the signal from the capillary height detecting means 29 that the tip end of the capillary 16 is raised to the height $H_1$, the control unit 30 then stops raising the capillary 16. In this case, since the clamper 17 is opened, the wire 81 is fed out of the tip end of the capillary 16.

As indicated by Step S210 in FIG. 13 and shown in FIG. 4H, the control unit 30 then issues a command to move the capillary 16 horizontally toward the pad 73 by a first distance of $L_1$. Based on this command, a signal from the movement mechanism interface 44 is output to the XY table 20. The XY table 20 then moves the capillary 16 toward the pad 73. The control unit 30 localizes the capillary 16 based on a signal from the XY position detecting means provided in the XY table 20 for detection of the XY position of the bonding head 19 to monitor if the capillary 16 is moved by the first distance $L_1$. If it is determined that the capillary 16 is moved by the first distance $L_1$, the control unit 30 then stops moving the capillary 16 horizontally. When the horizontal movement of the capillary 16 is stopped, the wire fed out of the tip end of the capillary 16 is formed in a first folded portion 86 folded from the lead 74 toward the pad 73.

Figure 14:
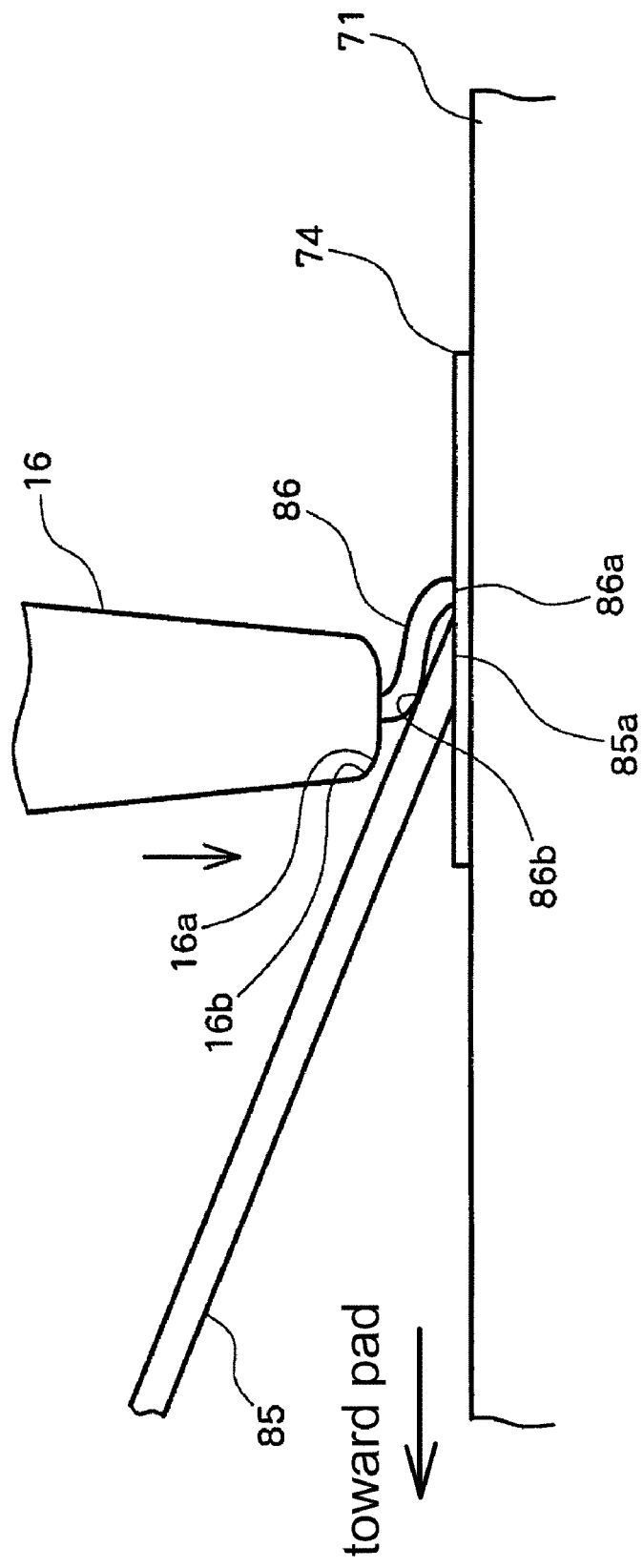
FIG. 14 illustrates the vicinity of a lead during an operation of a first trampling bonding step in a method of manufacturing a semiconductor device according to an exemplary embodiment of the present invention.

As indicated by Step S211 in FIG. 13 and shown in FIG. 4J, the control unit 30 issues a command to lower the capillary 16. Based on this command, a signal from the movement mechanism interface 44 is output to the bonding head 19. The Z-directional motor installed in the bonding head 19 is then driven to rotate the bonding arm 13 and thereby start to lower the capillary 16. When the capillary 16 is lowered, the lower face of the first folded portion 86 is brought into contact with the upper face of the wire loop 85, as shown in FIG. 14. At this point of time, the wire loop 85 extends obliquely downward to the bonded portion 85a where bonded to the lead 74. The first folded portion 86 extends in a slightly S-shaped arc along the upper face of the wire loop 85 from the point 86a where the center of the capillary 16 is positioned during the second bonding of the wire 81 to the lead 74 toward the pad 73, and further extends in a bent manner from the contact point 86b with the wire loop 85 toward the capillary 16 above. In the state shown in FIG. 14, neither the face portion 16a nor the outer radius portion 16b at the tip end of the capillary 16 is in contact with the wire loop 85.

Figure 15:
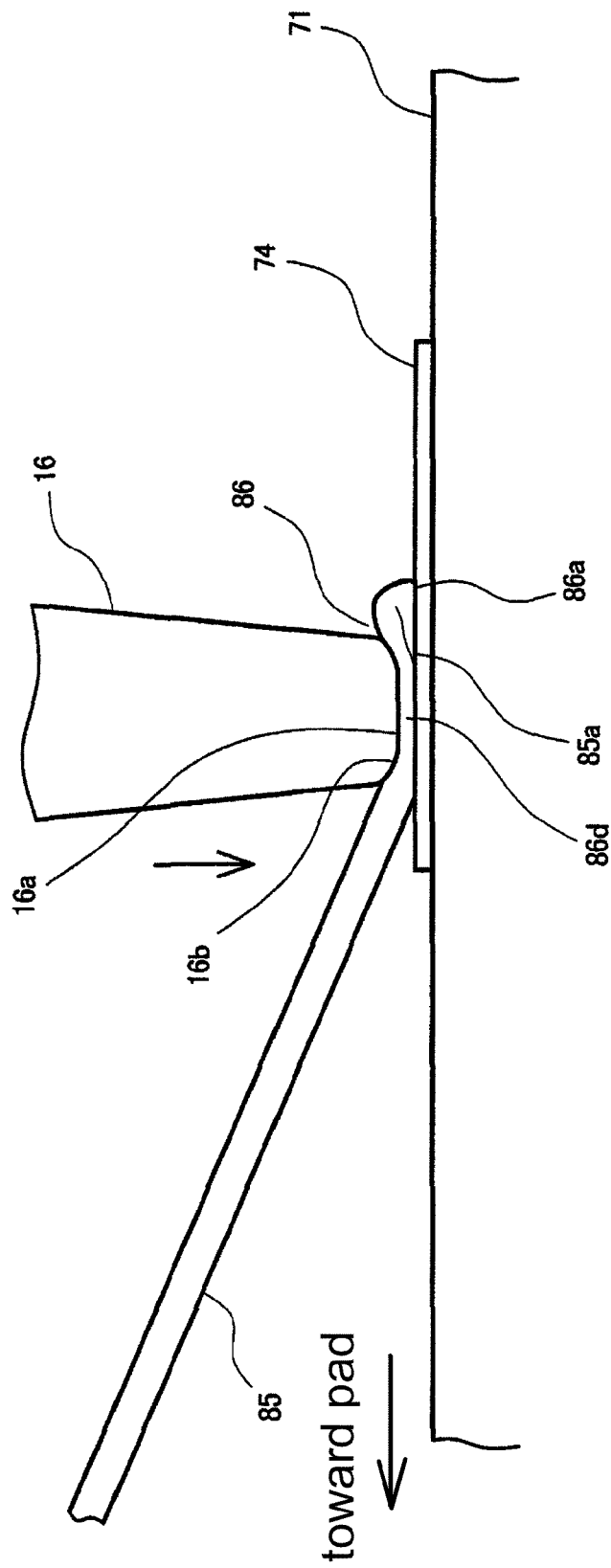
FIG. 15 illustrates the vicinity of the lead during another operation of the first trampling bonding step in the method of manufacturing a semiconductor device according to an exemplary embodiment of the present invention.

As indicated by Step S212 in FIG. 13 and shown in FIG. 15, when the capillary 16 is then further lowered, the face portion 16a of the capillary 16 presses the first folded portion 86 onto the wire loop 85 and the bonded portion 85a at the second bonding point. The first folded portion 86 and the wire loop 85 are trampled in an overlaid manner until the surface of the first folded portion 86 becomes flat (first trampling bonding) to form a first trampled portion 86d shown in FIG. 15. In this case, the first folded portion 86 can be pressed with the tip end of the capillary 16, and the ultrasonic vibrator 15 can be driven based on a signal from the ultrasonic vibrator interface 43 to vibrate the capillary 16. After forming the first trampled portion 86d, the control unit 30 completes the first trampling bonding step. It is noted that in the first trampling bonding step, the tip end of the capillary 16 can be lowered to a height from the surface of the lead 74 about half the diameter of the wire 81 to be bonded.

Following the first trampling bonding step, the control unit 30 performs a third folding step. As indicated by Step S213 in FIG. 13 and shown in FIG. 4K, the control unit 30 issues a command to raise the tip end of the capillary 16 to a height of $H_2$ with the clamper 17 being opened. Based on this command, a signal from the movement mechanism interface 44 is output to the bonding head 19. The Z-directional motor installed in the bonding head 19 is then driven to rotate the bonding arm 13 and thereby raise the capillary 16. The control unit 30 acquires a signal from the capillary height detecting means 29 via the capillary height detection interface 42 to monitor if the tip end of the capillary 16 is raised to the height $H_2$. If it is determined based on the signal from the capillary height detecting means 29 that the tip end of the capillary 16 is raised to the height $H_2$, the control unit 30 then stops raising the capillary 16. In this case, since the clamper 17 is opened, the wire 81 is fed out of the tip end of the capillary 16.

Figure 16:
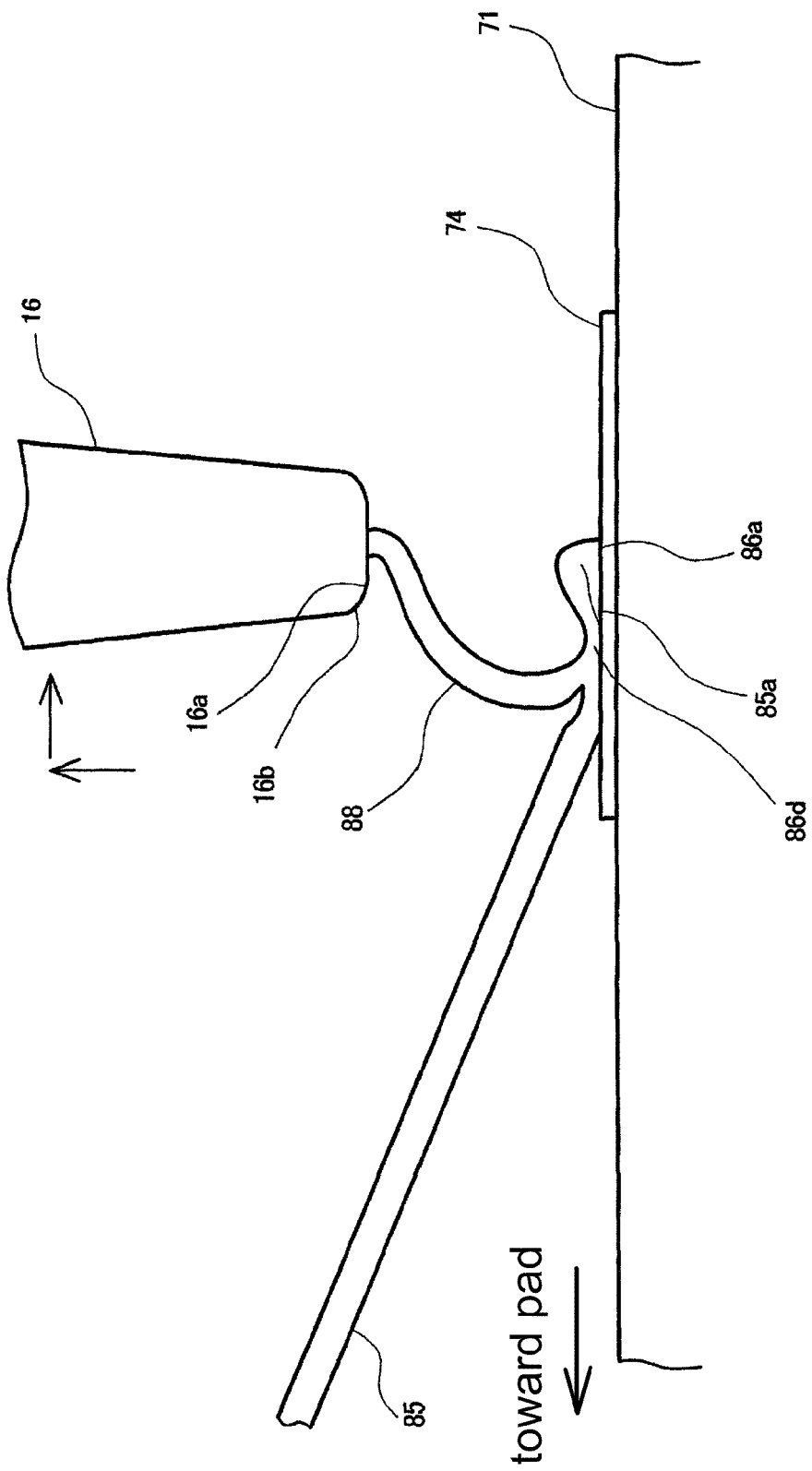
FIG. 16 illustrates the vicinity of the lead during an operation of a third folding step in the method of manufacturing a semiconductor device according to an exemplary embodiment of the present invention.

As indicated by Step S214 in FIG. 13 and shown in FIG. 4K, the control unit 30 issues a command to move the capillary 16 horizontally away from the pad 73 by a second distance of $L_2$ that is greater than the first distance $L_1$ of the horizontal movement in the first trampling bonding step. Based on this command, a signal from the movement mechanism interface 44 is output to the XY table 20. The XY table 20 then moves the capillary 16 away from the pad 73, that is, toward the lead 74. The control unit 30 localizes the capillary 16 based on a signal from the XY position detecting means provided in the XY table 20 for detection of the XY position of the bonding head 19 to monitor if the capillary 16 is moved by the second distance $L_2$. If it is determined that the capillary 16 is moved by the second distance $L_2$, the control unit 30 then stops moving the capillary 16 horizontally. When the horizontal movement of the capillary 16 is stopped, the wire fed out of the tip end of the capillary 16 is formed in a third folded portion 88 folded from the first trampled portion 86d toward the lead 74, as shown in FIG. 16. Since the second distance $L_2$ of the horizontal movement of the capillary 16 is greater than the first distance $L_1$ in the first trampling bonding step, in the state where the horizontal movement of the capillary 16 is stopped, the center of the capillary 16 is on the opposite side of the pad 73 with respect to the point 86a where the center of the capillary 16 is positioned during the second bonding, as shown in FIG. 16. That is, the center of the capillary 16 is positioned beyond the bonded portion 85a at the second bonding point. After moving the capillary 16 to the position, the control unit 30 completes the third folding step.

Figure 17:
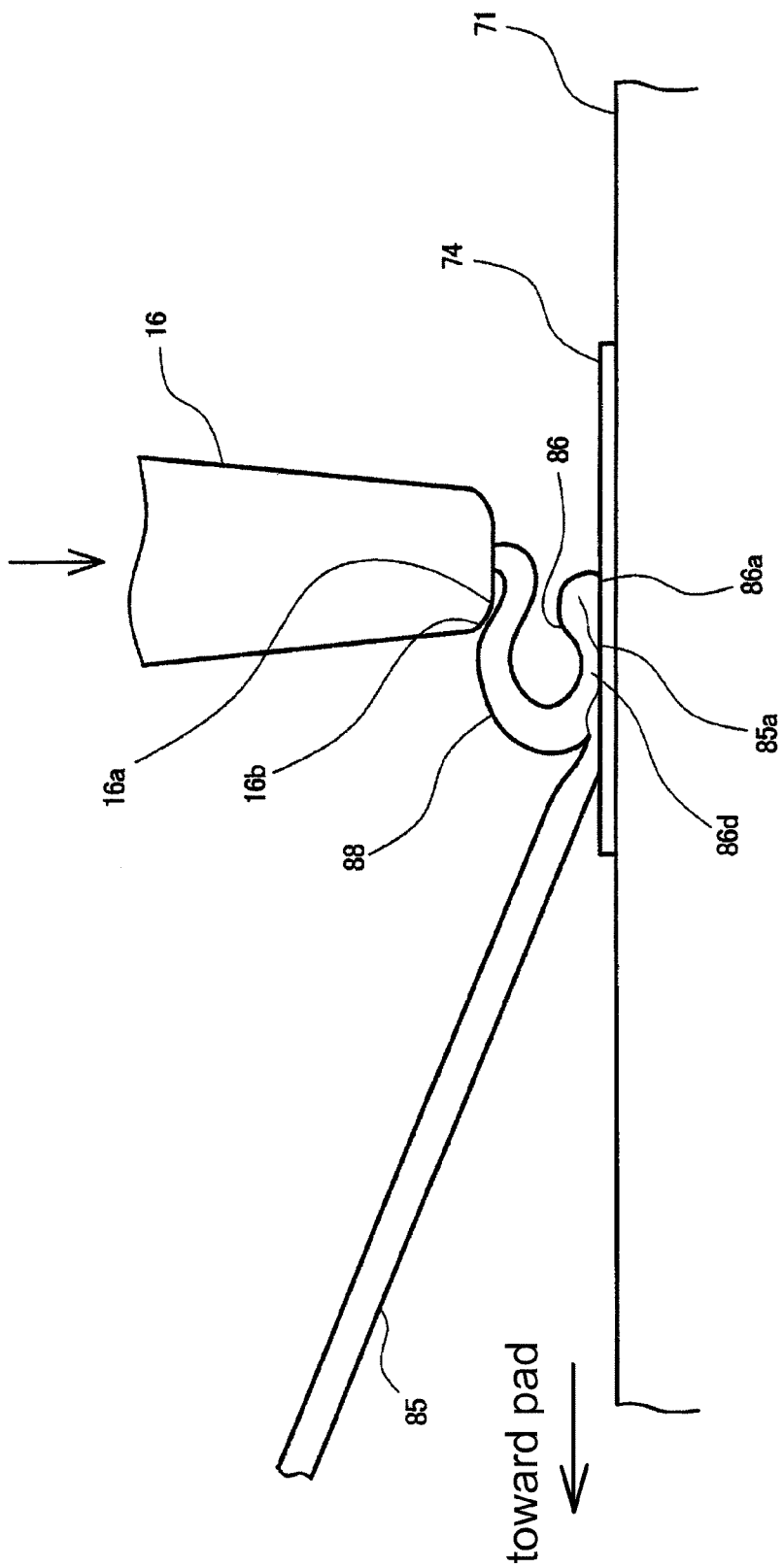
FIG. 17 illustrates the vicinity of the lead during another operation of the third folding step in the method of manufacturing a semiconductor device according to an exemplary embodiment of the present invention.

As indicated by Step S215 in FIG. 13, after the third folding step, the control unit 30 issues a command to perform a second trampling bonding step. Based on this command, a signal from the movement mechanism interface 44 is output to the bonding head 19. The Z-directional motor installed in the bonding head 19 is then driven to rotate the bonding arm 13 and thereby start to lower the capillary 16. When the capillary 16 is lowered, the third folded portion 88 is bent over the first trampled portion 86d, as shown in FIG. 17. Then the face portion 16a or the outer radius portion 16b of the capillary 16 closer to (located at the side of) the pad 73 comes into contact with a lateral face of the third folded portion 88, as shown in FIG. 17. Thus, the third folded portion 88 is further folded with the face portion 16a or the outer radius portion 16b.

Figure 18:
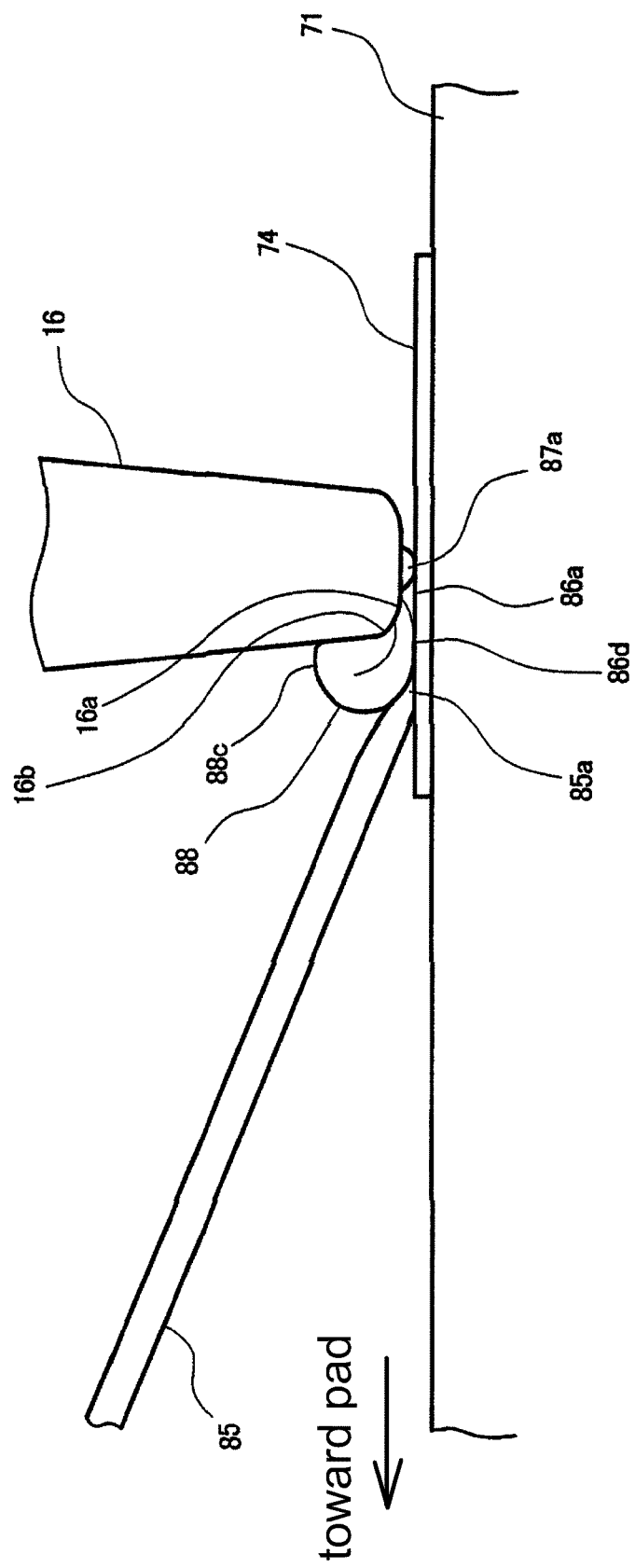
FIG. 18 illustrates the vicinity of the lead during an operation of a second trampling bonding step in the method of manufacturing a semiconductor device according to an exemplary embodiment of the present invention.

As shown in FIGS. 4L and 18, when the capillary 16 is further lowered, the face portion 16a and the outer radius portion 16b of the capillary 16 closer to (located at the side of) the pad 73 trample the third folded portion 88, so that the upper face of the portion is shaped according to the face portion 16a and the outer radius portion 16b of the capillary 16. At the same time, the end portion of the third folded portion 88 farther from the pad 73 is bonded to a point 87a on the lead 74 adjacent to the point 86a in such a manner that a portion of the third folded portion 88 is overlaid on the bonded portion 85a of the first trampled portion 86d and the wire loop 85 where bonded to the lead 74 and the first folded portion 86. In this case, the surface with which the face portion 16a of the capillary 16 comes into contact becomes flat according to the surface of the face portion 16a of the capillary. After the third folded portion 88 is bonded to the lead 74, the second trampling bonding step is completed. In this case, the third folded portion 88 can be pressed with the tip end of the capillary 16, and the ultrasonic vibrator 15 can be driven based on a signal from the ultrasonic vibrator interface 43 to vibrate the capillary 16.

After the second trampling bonding step, the control unit 30 issues a command to raise the capillary 16 with the clamper 17 being opened, as indicated by Step S216 in FIG. 13. Based on this command, a signal from the movement mechanism interface 44 is output to the bonding head 19. The Z-directional motor installed in the bonding head 19 is then driven to rotate the bonding arm 13 and thereby raise the capillary 16. In this case, since the clamper 17 is opened, the wire 81 is fed out of the tip end of the capillary 16.

Figure 19:
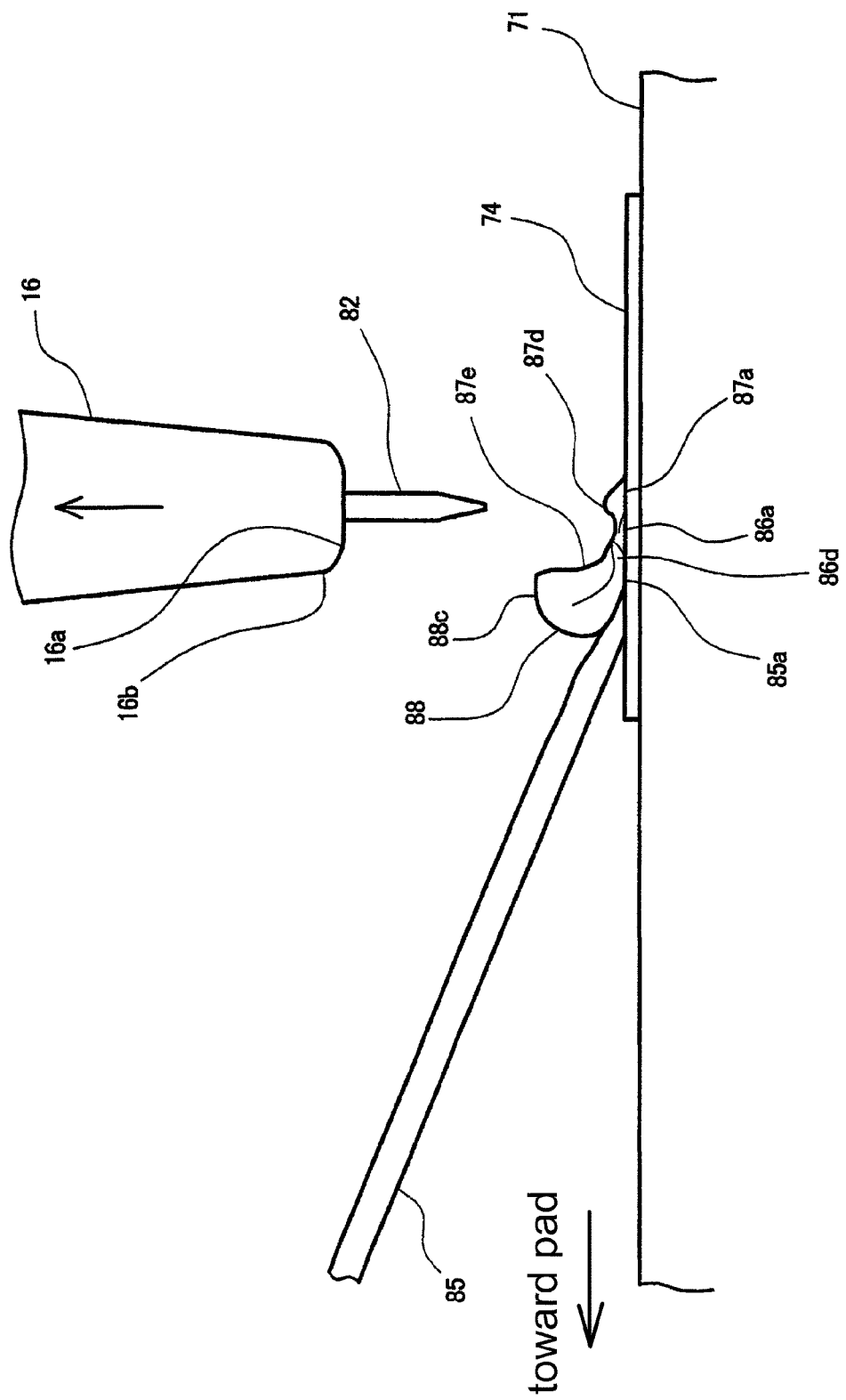
FIG. 19 illustrates the vicinity of the lead during a wire cutoff operation in the method of manufacturing a semiconductor device according to an exemplary embodiment of the present invention.

After the capillary 16 is raised by a predetermined distance, the control unit 30 issues a wire cutoff command, as indicated by Step S217 in FIG. 13. Based on this command, a signal from the clamper opening and closing mechanism interface 41 is output to the clamper opening and closing mechanism 27. The clamper opening and closing mechanism 27 then closes the clamper 17. When the capillary 16 is further raised with the clamper 17 being closed, the wire 81 is cut off, as shown in FIGS. 4M and 19, to be a state where a tail wire 82 extends out of the tip end of the capillary 16. Also, at the point 87a on the lead 74 where the center of the capillary 16 is positioned during the second trampling bonding, there is formed a roundly raised wire cutoff residual 87d.

Figure 20:
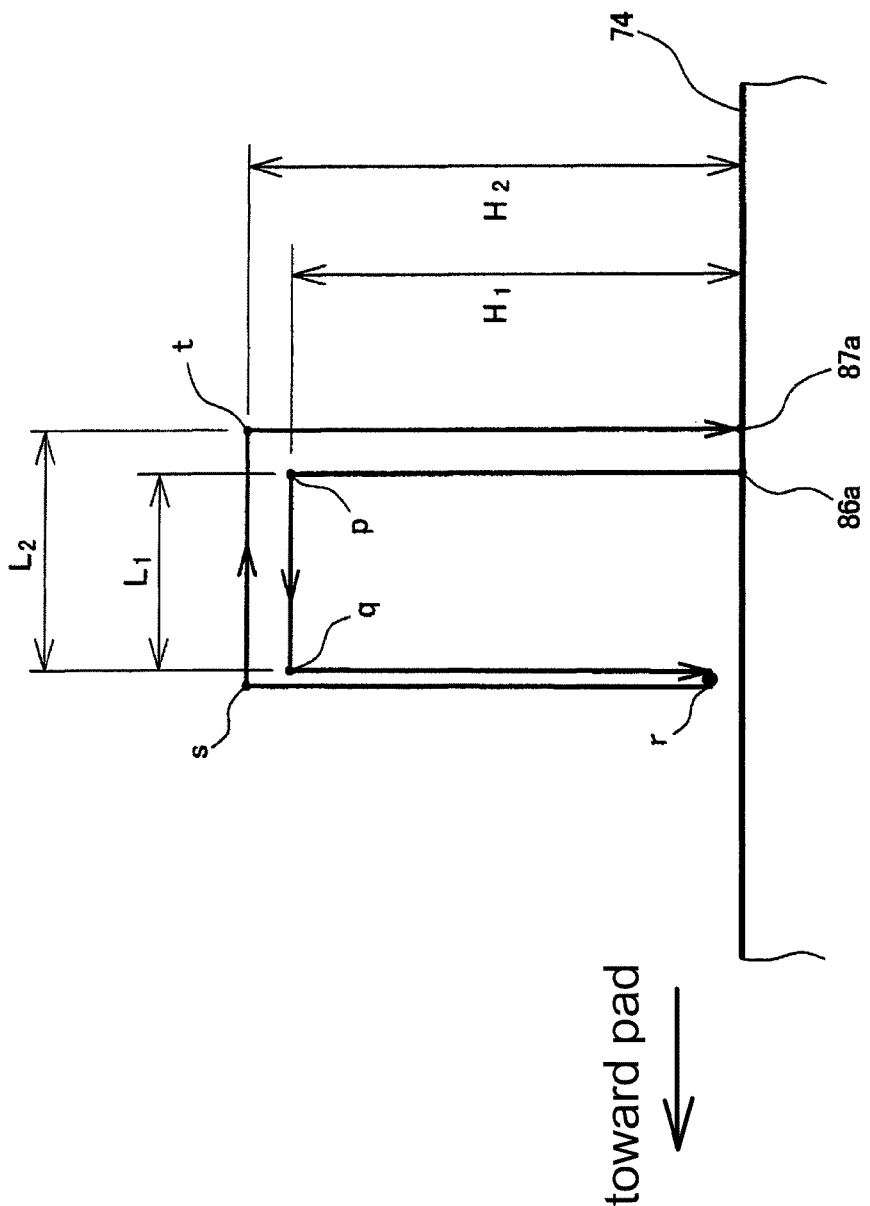
FIG. 20 illustrates a movement locus of a capillary in the method of manufacturing a semiconductor device according to an exemplary embodiment of the present invention.

FIG. 20 schematically illustrates the locus (trajectory) of the tip end of the capillary 16 through the first trampling bonding step, the third folding step, and the second trampling bonding step described above. As shown in FIG. 20, in the first trampling bonding step, the tip end of the capillary 16 is raised by the height $H_1$ from the point 86a where the center of the capillary 16 is positioned during the second bonding on the lead 74 to the point "p", and then moved horizontally by the first distance $L_1$ toward the pad 73, and lowered to the point "r" in the vicinity of (immediately adjacent to) the upper face of the lead 74 to form the first trampled portion 86d. The height of the point "r" from the surface of the lead 74 can be about half the diameter of the wire 81 to be bonded. In the third folding step, the tip end of the capillary 16 is raised from the point "r" to the height $H_2$, and then moved horizontally away from the pad 73, that is, toward the lead 74 by the second distance $L_2$, which is slightly greater than the first distance $L_1$. In the second trampling bonding step, the center of the capillary 16 is aligned with the point 87a adjacent to the point 86a on the opposite side of the pad 73 with respect to the point 86a, and then lowered to the point 87a on the lead 74.

Figure 21:
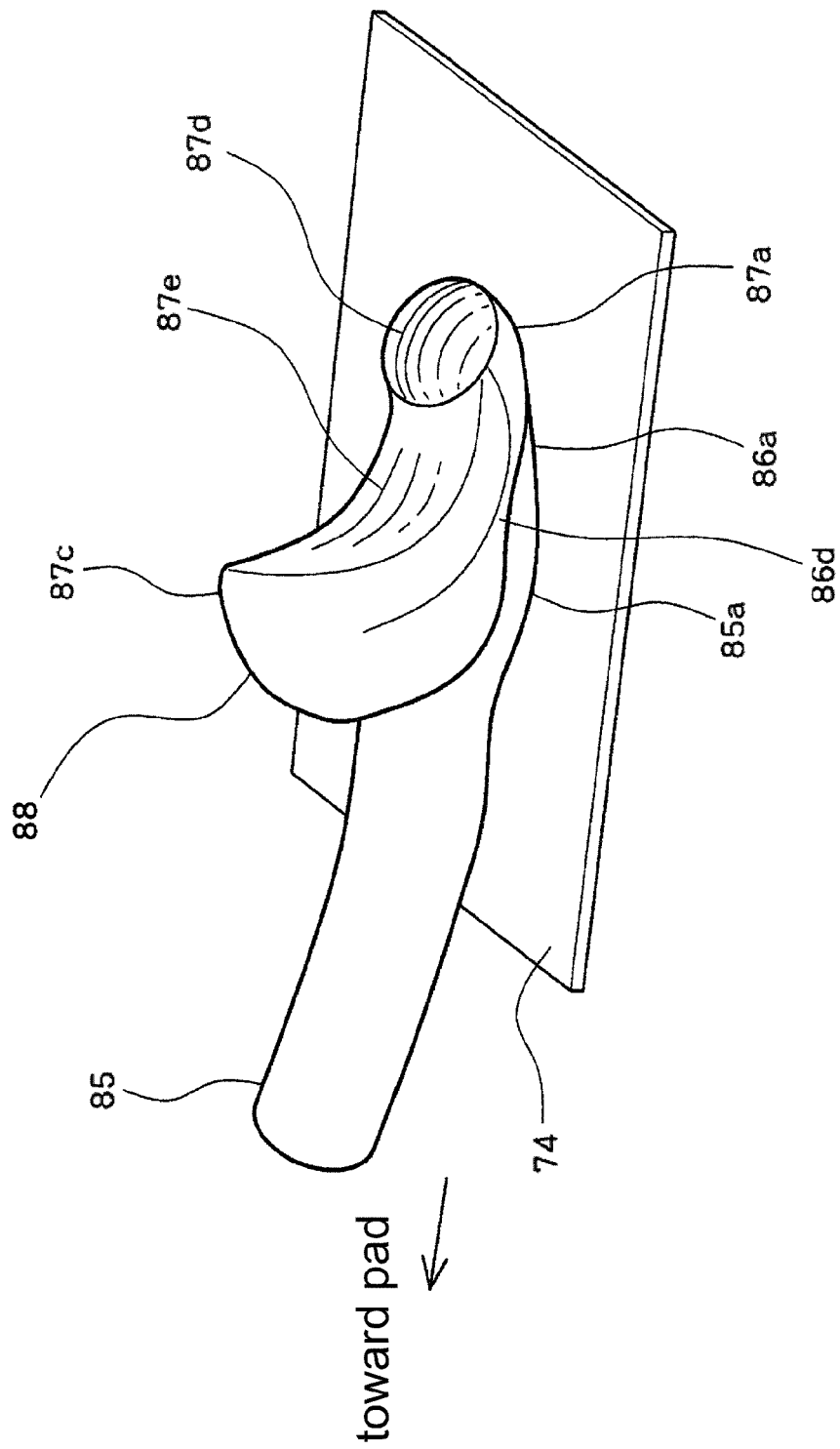
FIG. 21 is a perspective view illustrating a terminal of a wire loop closer to the lead according to an exemplary embodiment of the present invention.

FIG. 21 illustrates the shape of the terminal of the wire loop 85 closer to (located at the side of) the lead 74 formed through the above-described bonding operation. As shown in FIG. 21, the terminal closer to (located at the side of) the lead 74 is formed by the first trampled portion 86d and the end portion of the third folded portion 88 farther from the pad 73 being pressed and deformed in an overlaid manner on the bonded portion 85a of the wire loop 85 where bonded to the lead 74. The surface of the first trampled portion 86d and the end portion of the third folded portion 88 farther from the pad 73 is formed in a cylindrical recess 87e following the shape of the tip end of the capillary 16. The end portion of the recess 87e farther from the pad 73 is the roundly raised wire cutoff residual 87d. The first trampled portion 86d extends along the surface of the lead 74 from the wire cutoff residual 87d toward the pad 73. The third folded portion 88 extends in a roll-up manner on the upper face of the first trampled portion 86d from the wire cutoff residual 87d toward the pad 73, and the end portion 87c thereof closer to (located at the side of) the pad 73 is folded to be a round end. The first folded portion 86 is also integrated in the roundly raised wire cutoff residual 87d.

As described heretofore, in this exemplary embodiment, the first trampled portion 86d and the third folded portion 88 are bonded to the terminal of the wire loop 85 closer to (located at the side of) the lead 74 in an overlaid manner, whereby the strength of bonding between the wire loop 85 and the lead 74 is increased. Also, a portion of the first trampled portion 86d and the third folded portion 88 is pressed and deformed with the tip end of the capillary 16 on the bonded portion 85a of the wire loop 85 where bonded to the lead 74, resulting in a compact shape. At the same time, the shape of the terminal of the wire loop 85 can be formed stably. Further, the thickness of the bonded portion where bonded to the lead 74 can be increased, which allows for preventing heel crack effectively.

Although the second distance $L_2$ of the horizontal movement is greater than the first distance $L_1$ of the horizontal movement in the first trampling bonding step in the above description of this exemplary embodiment, the second distance $L_2$ of the horizontal movement can be equal to or smaller than the first distance $L_1$ of the horizontal movement in the first trampling bonding step.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A method of manufacturing a semiconductor device having a wire loop to be connected to a first bonding point and a second bonding point with a capillary, the method comprising:

a first bonding step of bonding a wire to a first bonding point by means of a capillary;

a second bonding step of, after the first bonding step, bonding the wire to a second bonding point by means of the capillary in such a manner that the capillary is raised while feeding the wire out of the tip end of the capillary and subsequently looped to the second bonding point along a predetermined trajectory, and then the wire is bonded to the second bonding point, thereby forming a wire loop connecting to the first bonding point and the second bonding point;

a first trampling bonding step of, after the second bonding step, trampling the wire to the wire loop by means of the capillary in such a manner that the capillary is raised while feeding the wire out of the tip end of the capillary and subsequently moved toward the first bonding point by a first predetermined distance, and then the capillary is lowered to the wire loop to bond the wire fed out of the tip end of the capillary onto the wire loop and the portion where the wire has bonded to the second bonding point, thereby forming a first trampled portion while folding and trampling thereon;

a third folding step of, after the first trampling bonding step, folding the wire to the first trampled portion by means of the capillary in such a manner that the capillary is raised while further feeding the wire out of the tip end thereof and subsequently moved in a direction opposite to the first bonding point by a second predetermined distance, and then the capillary is lowered, thereby forming the wire further fed out of the tip end of the capillary into a third folded portion having a shape that follows the upper face on the first trampled portion; and a second trampling bonding step of, after the third folding step, bonding the wire by means of the capillary in such a manner that the capillary is lowered to bond the wire to immediately adjacent to the bonded portion where the wire has bonded to the second bonding point, thereby bonding the wire thereon while causing the capillary to trample at least a portion of the third folded portion located at the second bonding point side with a face portion of the capillary located at the first bonding point side in such a manner as to be overlapped onto the first trampled portion.

2. The method of manufacturing a semiconductor device according to claim 1, wherein the first trampling bonding step is arranged such that the wire fed out of the tip end of the capillary is folded onto the wire loop and the portion where the wire has bonded to the second bonding point, and trampled until a portion of the surface thereof is made into a flat.

3. The method of manufacturing a semiconductor device according to claim 1, wherein the second trampling bonding step is arranged such that at least a portion of the third folded portion located at the second bonding point side is trampled onto the first trampled portion with the face portion located at the first bonding point side of the capillary until a portion of the surface thereof is made into a flat.

* * * * *